US011635463B1

(12) United States Patent
Venkatesan et al.

(10) Patent No.: US 11,635,463 B1
(45) Date of Patent: Apr. 25, 2023

(54) SYSTEM AND METHODS FOR IJTAG REDUCED ACCESS TIME IN A HIERARCHICAL DESIGN

(71) Applicant: Marvell Asia Pte, Ltd., Singapore (SG)

(72) Inventors: Krishnaraj Venkatesan, San Jose, CA (US); Raghuveer Shivaraj, San Jose, CA (US)

(73) Assignee: Marvell Asia Pte Ltd, Singapore (SG)

( * ) Notice: Subject to any disclaimer, the term of this patent is extended or adjusted under 35 U.S.C. 154(b) by 71 days.

(21) Appl. No.: 17/373,007

(22) Filed: Jul. 12, 2021

Related U.S. Application Data

(60) Provisional application No. 63/052,362, filed on Jul. 15, 2020.

(51) Int. Cl.
*G01R 31/3177* (2006.01)
*G06F 30/333* (2020.01)

(52) U.S. Cl.
CPC ....... *G01R 31/3177* (2013.01); *G06F 30/333* (2020.01)

(58) Field of Classification Search
None
See application file for complete search history.

(56) References Cited

U.S. PATENT DOCUMENTS

| 2012/0278674 | A1* | 11/2012 | Whetsel | G01R 31/3177 714/E11.155 |
| 2018/0348299 | A1* | 12/2018 | Mistry | G01R 31/31908 |
| 2019/0113568 | A1* | 4/2019 | Bowling | G01R 31/31723 |
| 2019/0128963 | A1* | 5/2019 | Wu | G01R 31/318558 |

FOREIGN PATENT DOCUMENTS

| DE | 102018124298 A1 * | 5/2019 | ......... G01R 31/3181 |
| WO | WO-2022039831 A1 * | 2/2022 | |

* cited by examiner

*Primary Examiner* — Guerrier Merant

(57) ABSTRACT

A system includes a test access port (TAP) configured to provide internal joint test action group (IJTAG) access to one or more test data registry (TDR). The system further includes a plurality of hierarchical electronic components, wherein each hierarchical electronic component includes a de-asserted segment inserted bit (D-SIB) register, an asserted segment inserted bit (A-SIB) register, and a TDR associated with the D-SIB register. Each D-SIB register is configured to prevent access to its associated TDR when a reset signal is asserted and each A-SIB register is configured to provide access to its subsequent A-SIB register or D-SIB register coupled thereto when the reset signal is asserted.

25 Claims, 37 Drawing Sheets

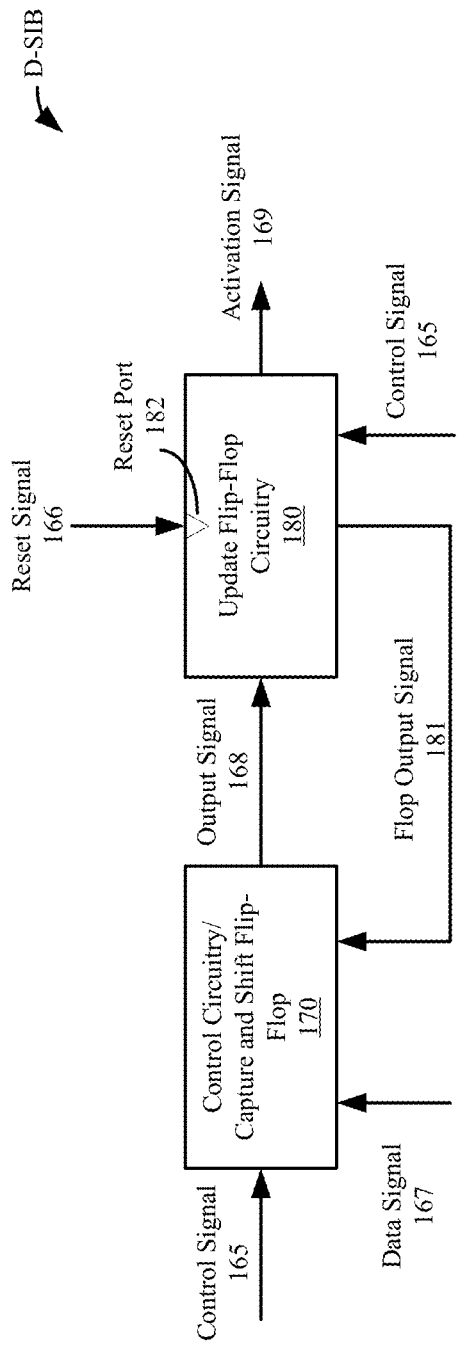
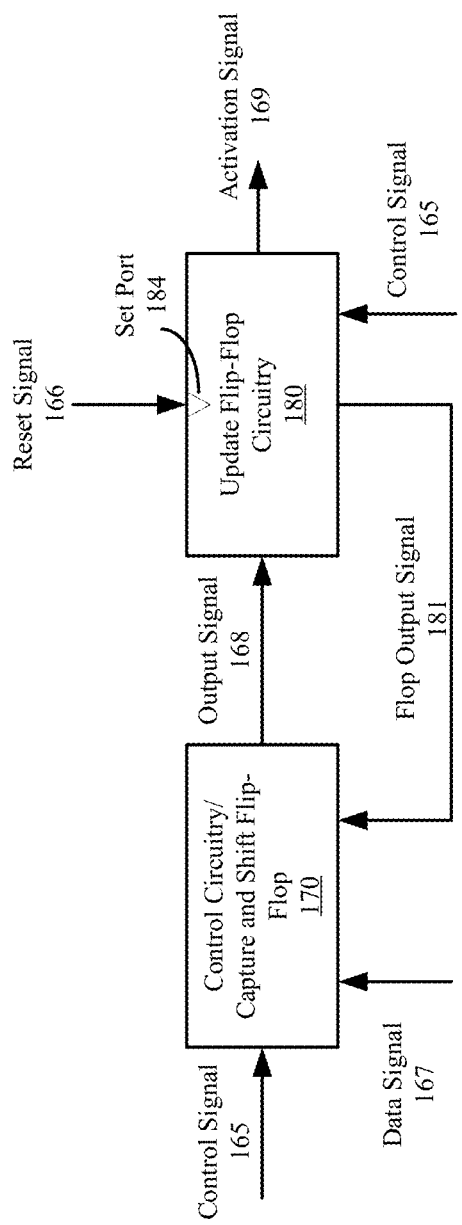
Figure 1B
Figure 1C

US 11,635,463 B1

SYSTEM AND METHODS FOR IJTAG REDUCED ACCESS TIME IN A HIERARCHICAL DESIGN

CROSS-REFERENCE TO RELATED APPLICATIONS

This application claims the benefit and priority to the U.S. Provisional Patent Application No. 63/052,362, filed Jul. 15, 2020, which is incorporated herein in its entirety by reference.

BACKGROUND

Electronic devices have become an integral part of daily life. Generally, verifying the design and testing the printed circuit board of an electronic device after manufacturing is desirable and may be performed using different standards such as Joint Test Action Group (JTAG) or Internal JTAG (IJTAG). JTAG and IJTAG implement standards for on-chip instrumentation in electronic design automation of the electronic device.

In recent years, designs of many electronic devices have become hierarchical in nature, wherein multiple pass throughs and iterations occur in order to use JTAG or IJTAG to verify a design of an electronic device, especially to access and/or program a test data register (TDR) of the electronic device. In some embodiments, the TDR is further down the hierarchical chain/level because at each iteration one hierarchical level is passed through until the desired hierarchical level is reached. As such, the hierarchical designs have unfortunately resulted in an increased access time. In other words, the number of clock cycles needed to access/program a TDR that is further down the hierarchical chain/level has increased significantly.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 1B-1C depict an example of an architecture for a de-asserted segment insertion bit (D-SIB) register and an asserted segment insertion bit (A-SIB) register according to one aspect of the present embodiments.

DETAILED DESCRIPTION

Figure 1A:
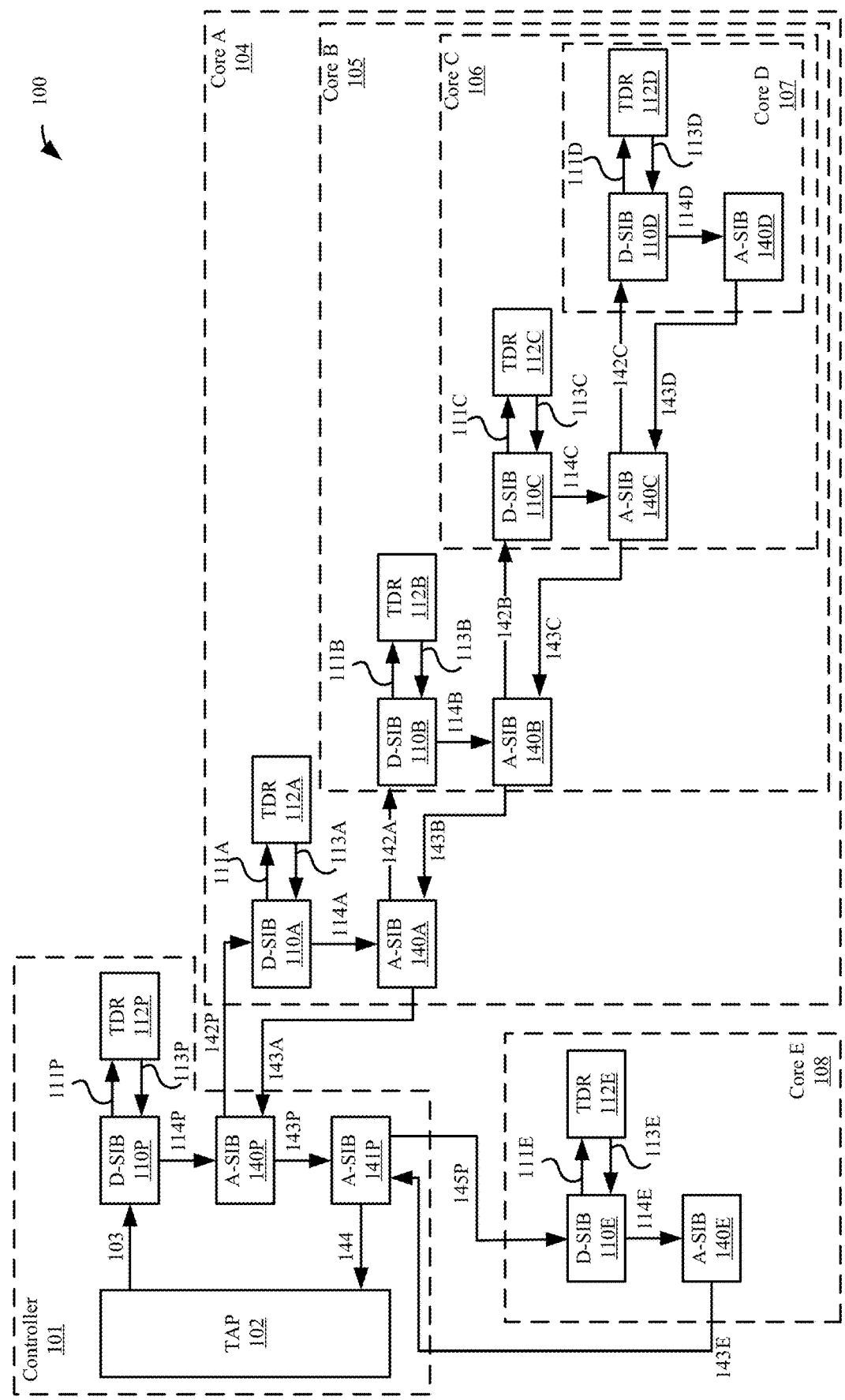
FIG. 1A depicts an example of a diagram of a hardware-based system configured to support internal joint test action group (IJTAG) access to one or more test data registry (TDR) according to one aspect of the present embodiments.

The following disclosure provides many different embodiments, or examples, for implementing different features of the subject matter. Specific examples of components and arrangements are described below to simplify the present disclosure. These are, of course, merely examples and are not intended to be limiting. In addition, the present disclosure may repeat reference numerals and/or letters in the various examples. This repetition is for the purpose of simplicity and clarity and does not in itself dictate a relationship between the various embodiments and/or configurations discussed.

Before various embodiments are described in greater detail, it should be understood that the embodiments are not limiting, as elements in such embodiments may vary. It should likewise be understood that a particular embodiment described and/or illustrated herein has elements which may be readily separated from the particular embodiment and optionally combined with any of several other embodiments or substituted for elements in any of several other embodiments described herein. It should also be understood that the terminology used herein is for the purpose of describing the certain concepts, and the terminology is not intended to be limiting. Unless defined otherwise, all technical and scientific terms used herein have the same meaning as commonly understood in the art to which the embodiments pertain.

A need has arisen to reduce the amount of time (i.e. number of clock cycles) that is needed to provide a JTAG or IJTAG standard access to a TDR, and to test and verify the hierarchical design of an electronic device. It is appreciated that the hierarchical design may include hierarchical electronic components at each level or node in the hierarchical design. Hierarchical electronic components at each level may be parent and/or child of another node (i.e. hierarchical electronic component).

In some cases, a segment insertion bit (SIB) register, which for a non-limiting example can be a one bit register, has been used by IJTAG and JTAG to provide access to various hierarchical levels/nodes and to provide access for programming a TDR at a given node. In some cases, when an asserted reset signal is received, one iteration is passed through for each hierarchical level (hereinafter referred to as a set of hierarchical electronic components) until the desired hierarchical electronic components is reached and programmed. Accordingly, many iterations are needed for the JTAG and IJTAG standard to reach a child node that is further down the hierarchical level.

A new approach is proposed such that a SIB coupled to a TDR is replaced with a de-asserted SIB (D-SIB) register and other SIB registers coupled to SIB registers within the same hierarchical level or to a child hierarchical level are replaced with a set of asserted SIB (A-SIB) registers. Under the proposed approach, when a reset signal is asserted, access to TDRs in the first iteration is prevented using the D-SIB register while access is provided between the A-SIB registers within the same hierarchical level as well as to any D-SIB registers at a different hierarchical level that a A-SIB register is coupled to (i.e. parent/child). In other words, in the first iteration when a reset signal is asserted, all A-SIB and D-SIB registers are coupled in IJTAG chain while the D-SIB registers prevent access to their corresponding TDRs. In subsequent iterations, the A-SIB and D-SIB registers or a subset thereof may be programmed to provide access to their respective TDRs in order for the desired TDRs to be programmed and/or prevent or grant access to a child hierarchical level. Once the desired TDRs are programmed, IJTAG or JTAG provides access to the programmed TDRs.

It is appreciated that in some embodiments, the structure and components of the A-SIB register is the same as that of D-SIB register except that the reset signal is coupled to set port of the flipflop within the A-SIB register whereas in the D-SIB register the reset signal is coupled to the reset port of the flipflop. As such, on reset, the D-SIB register prevents access to its associated (i.e. coupled) TDR while the A-SIB register provides access to other D-SIB registers and/or A-SIB registers that the A-SIB register is coupled to regardless of whether they are within the same hierarchical level or in parent/child. As such, instead of many iterations to reach a hierarchical electronic component that is further down the hierarchical level, the hierarchical electronic component can be reached within the same iteration, thereby reducing access time.

FIG. 1A depicts an example of a diagram of a hardware-based system configured to support IJTAG access to one or more TDR according to one aspect of the present embodiments.

Although the diagrams depict components as functionally separate, such depiction is merely for illustrative purposes. It will be apparent that the components portrayed in this figure can be arbitrarily combined or divided into separate software, firmware and/or hardware components. Furthermore, it will also be apparent that such components, regardless of how they are combined or divided, can execute on the same host or multiple hosts, and wherein the multiple hosts can be coupled by one or more networks. When the software instructions are executed, the one or more hardware components becomes a special purposed hardware component for providing IJTAG access to one or more TDRs.

In the example of FIG. 1A, a nonlimiting and an illustrative example of a hierarchical electronic design 100 is shown, which includes a plurality of hierarchical electronic components (also referred to as levels/nodes interchangeably). In this nonlimiting example, the highest level of the hierarchical electronic design 100 is a first hierarchical electronic components that in this example is a controller 101, e.g., a Design For Test (DFT) controller. The highest node (i.e. controller 101) is a parent to two hierarchical electronic components, core A 104 and core E 108. In other words, core A 104 and core E 108 have a parent/child relationship to the controller 101. In this nonlimiting example, core A 104 is a parent in the hierarchical structure to another hierarchical electronic component such as core B 105. In other words, core B 105 is a child of parent core A 104. In this nonlimiting example, core B 105 is a parent in the hierarchical structure to another hierarchical electronic component such as core C 106. In other words, core C 106 is a child of parent core B 105. Similarly, in this nonlimiting example, core C 106 is a parent in the hierarchical structure to another hierarchical electronic component such as core D 107. In other words, core D 107 is a child of parent core C 106.

It is appreciated that the particular arrangement of the parent/child relationship of the hierarchical electronic components is for illustrative purposes only and should not be construed as limiting the scope of the embodiments. For example, controller 101 may have three or more child nodes and it is further appreciated that each of nodes may have more child nodes. Moreover, it is appreciated that the discussion with respect to controller 101 and cores 104-108 is for illustrative purposes and should not be construed as limiting the scope of the embodiments. For example, each level of the hierarchical electronic components may be a core or any other electronic design. A core may include one or more processing units and one or more memory components.

In the example of FIG. 1A, the nonlimiting hierarchical design 100 may include a test access port (TAP) 102 that is configured to provide IJTAG access to one or more A-SIB and D-SIB. It is appreciated that the TAP 102 may be part of the hierarchical electronic components, e.g., controller 101. The controller 101 further includes a D-SIB 110P, a TDR 112P, an A-SIB 140P, and an A-SIB 141P. It is appreciated that D-SIB registers are referred to as D-SIB for simplicity and that A-SIB registers are referred to as A-SIB for simplicity.

In some embodiments, D-SIB 110P receives data via connection 103 from TAP 102. D-SIB 110P is coupled to its associated TDR 112P and is configured to send and receive data to and from the TDR 112P via connections 111P and 113P respectively. The data output of D-SIB 110P is coupled to data input of A-SIB 140P via connection 114P and the data output of A-SIB 140P is coupled to data input A-SIB 141P via connection 143P. It is appreciated that A-SIB 141P outputs data to TAP 102 via connection 144. It is appreciated that the connections that are illustrated are data connections (and not control signals). It is also appreciated that the hierarchical design 100 may include control signals (not shown) that control access of each component to other components and/or nodes within the same hierarchical level or to different hierarchical level.

The example as illustrated by the example of FIG. 1A replaces a traditional SIB that is coupled to a TDR with a D-SIB and all other SIBs with A-SIBs (operations of which is described later in this application). In other words, D-SIB controls access to its corresponding TDR whereas A-SIB controls access to another A-SIB within the same hierarchical electronic components level or to a D-SIB and A-SIB in a child level of the hierarchical electronic components.

In the nonlimiting example of FIG. 1A, controller 101 has two children nodes/levels, core A 104 and core E 108. Core A 104 includes D-SIB 110A with its corresponding TDR 112A and an A-SIB 140A. The data output from A-SIB 140P is input to D-SIB 110A via connection 142P. D-SIB 110A is coupled to its associated TDR 112A and is configured to send and receive data to and from the TDR 112A via connections 111A and 113A respectively. The data output of D-SIB 110A is coupled to data input of A-SIB 140A via connection 114A. It is appreciated that data traversal through the hierarchical structure from parent to its child/children is described and then the traversal back from the child node to its parent.

In the nonlimiting example of FIG. 1A, core A 104 has a child node core B 105. Core B 105 includes D-SIB 110B with its corresponding TDR 112B and an A-SIB 140B. The data output from A-SIB 140A is input to D-SIB 110B via connection 142A. D-SIB 110B is coupled to its associated TDR 112B and is configured to send and receive data to and from the TDR 112B via connections 111B and 113B respectively. The data output of D-SIB 110E is coupled to data input of A-SIB 140B via connection 114B.

In the nonlimiting example of FIG. 1A, core B 105 has a child node core C 106. Core C 106 includes D-SIB 110C with its corresponding TDR 112C and an A-SIB 140C. The data output from A-SIB 140B is input to D-SIB 110C via connection 142B. D-SIB 110C is coupled to its associated TDR 112O and is configured to send and receive data to and from the TDR 112C via connections 111C and 113C respectively. The data output of D-SIB 110C is coupled to data input of A-SIB 140C via connection 114C.

In the nonlimiting example of FIG. 1A, core C 106 has a child node core D 107. Core D 104 includes D-SIB 110D with its corresponding TDR 112D and an A-SIB 140D. The data output from A-SIB 140C is input to D-SIB 110D via connection 142C. D-SIB 110D is coupled to its associated TDR 112D and is configured to send and receive data to and from the TDR 112D via connections 111D and 113D respectively. The data output of D-SIB 110D is coupled to data input of A-SIB 140D via connection 114D.

In some embodiments, the data is output from A-SIB 140D of core D 107 to the input of A-SIB 140C via connection 143D. The data is output from A-SIB 140C of core C 106 to the input of A-SIB 140B via connection 143C. The data is output from A-SIB 140B of core B 105 to the input of A-SIB 140A via connection 143B, and subsequently from A-SIB 140A back to A-SIB 140P via connection 143A.

It is appreciated that a similar traversal occurs for the data to go from the controller 101 to the other child node, e.g., core E 108. In the nonlimiting example of FIG. 1A, core E 108 includes D-SIB 110E with its corresponding TDR 112E and an A-SIB 140E. The data output from A-SIB 141P is input to D-SIB HOE via connection 145P. D-SIB 110E is coupled to its associated TDR 112E and is configured to send and receive data to and from the TDR 112E via connections 111E and 113E respectively. The data output of D-SIB 110E is coupled to data input of A-SIB 140E via connection 114E. The data is output from A-SIB 140E to the input of A-SIB 141P via connection 143E. It is appreciated that the data is subsequently output from A-SIB 141P to TAP 102 via connection 144.

It is appreciated that the operation of the hierarchical design that provides IJTAG access to one or more TDRs is described in subsequent figures. However, first the architecture and design of A-SIB and D-SIB is described.

FIGS. 1B-1C depict an example of an architecture for a D-SIB register and an A-SIB register according to one aspect of the present embodiments. Referring to FIG. 1B, a D-SIB register is illustrated. In this nonlimiting example, a control circuitry/capture and shift flip-flop 170 (that includes a capture and shift flip-flop as well as control circuitry such as logical AND gates, multiplexers, etc.) that is coupled to update flip-flop circuitry 180. The D-SIB in this nonlimiting example is a one bit register.

It is appreciated that the control circuitry/capture and shift flip-flop 170 receives control signal 165 (one or more signals) and the data signal 167, and outputs signal 168 to the update flip-flop circuitry 180. The control signal 165 control whether access to the D-SIB that is coupled to is provided or whether access is denied (i.e. bypassed). The data signal 167 is used to program the D-SIB when the register is coupled, e.g., the register may be programmed with a 0 or a 1 value. The update flip-flop circuitry 180 generates a flop output signal 181 and activation signal 169 based on whether a reset signal 166 is asserted or de-asserted and further based on the output signal 168. The flop output signal 181 is input to the control circuitry/capture and shift flip-flop 170. If the activation signal 169 is asserted, it grants access to the associated child network coupled thereto and if de-asserted prevents access to the child network coupled thereto. In other words, if the activation signal 169 is asserted the child network is coupled and access is provided and if the activation signal 169 is de-asserted the child network is uncoupled and access is prevented. It is appreciated that the reset signal 166 is coupled to the reset port 182 of the update flip-flop circuitry 180, and as such generates a flop output signal 181 of 0 as well as the activation signal 169 with value 0, thereby preventing access to the associated TDR coupled thereto on reset.

Referring now to FIG. 1C, an A-SIB in accordance with one aspect of the present embodiments is shown. The A-SIB has the same components and architecture as a D-SIB described above, except that the reset signal 166 is coupled to the set port 184 of the update flip-flop circuitry 180. Accordingly, unlike D-SIB that prevents access to its coupled child network on asserted reset signal, the A-SIB provides access to its child network coupled thereto on any asserted reset signal. The operation of A-SIB and D-SIB are further clarified below.

Figure 2A:
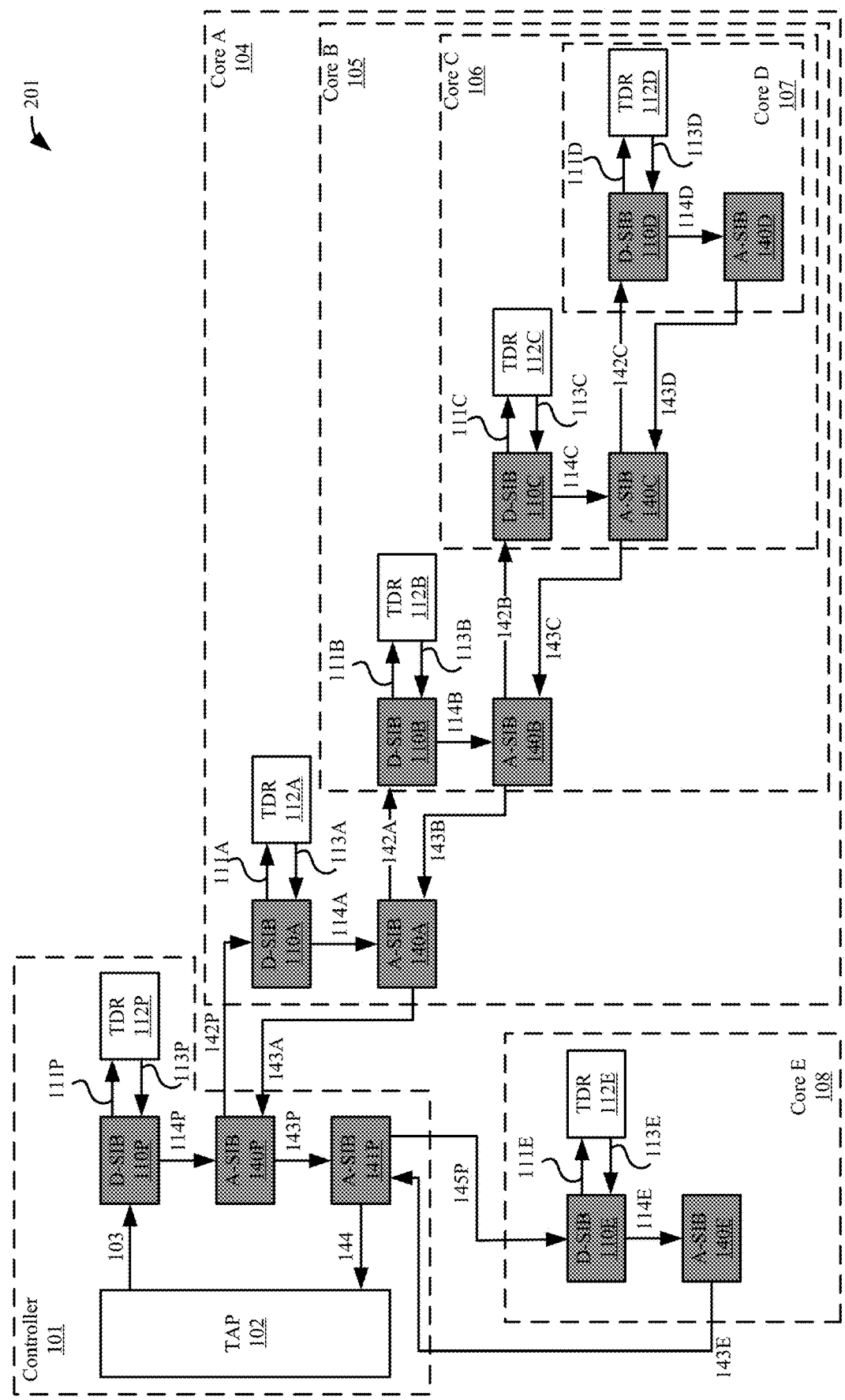
FIG. 2A depicts an example of a plurality of hierarchical electronic components at the end of first iteration when a reset signal is asserted according to one aspect of the present embodiments.

FIG. 2A depicts an example of a plurality of hierarchical electronic components in the design 100 of FIG. 1A at the end of first iteration 201 when a reset signal is asserted according to one aspect of the present embodiments. In this nonlimiting example, a reset signal is asserted and as a result access is provided to all D-SIB and A-SIB registers that are coupled in IJTAG chain. However, D-SIB registers prevent access to its associated TDR (i.e. coupled TDR) in the first iteration. In contrast, any A-SIB provides access to any D-SIB or A-SIB it is coupled to whether it is in same hierarchical level or a child. For example, when the reset signal is asserted, D-SIB 110P prevents access to its coupled TDR 112P, similarly D-SIB 110A prevents access to its coupled TDR 112A, D-SIB 110B prevents access to its coupled TDR 112B, D-SIB 110C prevents access to its coupled TDR 112C, D-SIB 110D prevents access to its coupled TDR 112D, and finally D-SIB 110E prevents access to its coupled TDR 112E.

In some embodiments, each A-SIB gets asserted and provides access to any D-SIB and A-SIB that it is coupled to when a reset signal is asserted. For example, A-SIB 140P gets asserted and provides access to D-SIB 110A and A-SIB 140A within its child (i.e. core A 104) that it is coupled to when a reset signal is asserted. Similarly, A-SIB 140A gets asserted and provides access to D-SIB 110B and A-SIB 140B within its child (i.e. core B 105) that it is coupled to when a reset signal is asserted. A-SIB 140B gets asserted and provides access to D-SIB 110C and A-SIB 140C within its child (i.e. core C 106) that it is coupled to when a reset signal is asserted. A-SIB 140C provides access to D-SIB 110D and A-SIB 140D within its child (i.e. core D 107) that it is coupled to when a reset signal is asserted. A-SIB 140D does not have any child network and therefore its presence is optional and provided for illustrative purposes only. A-SIB 141P gets asserted and provides access to D-SIB 110E and A-SIB 140E within its child (i.e. core E 108) that it is coupled to when a reset signal is asserted.

Figure 2B:
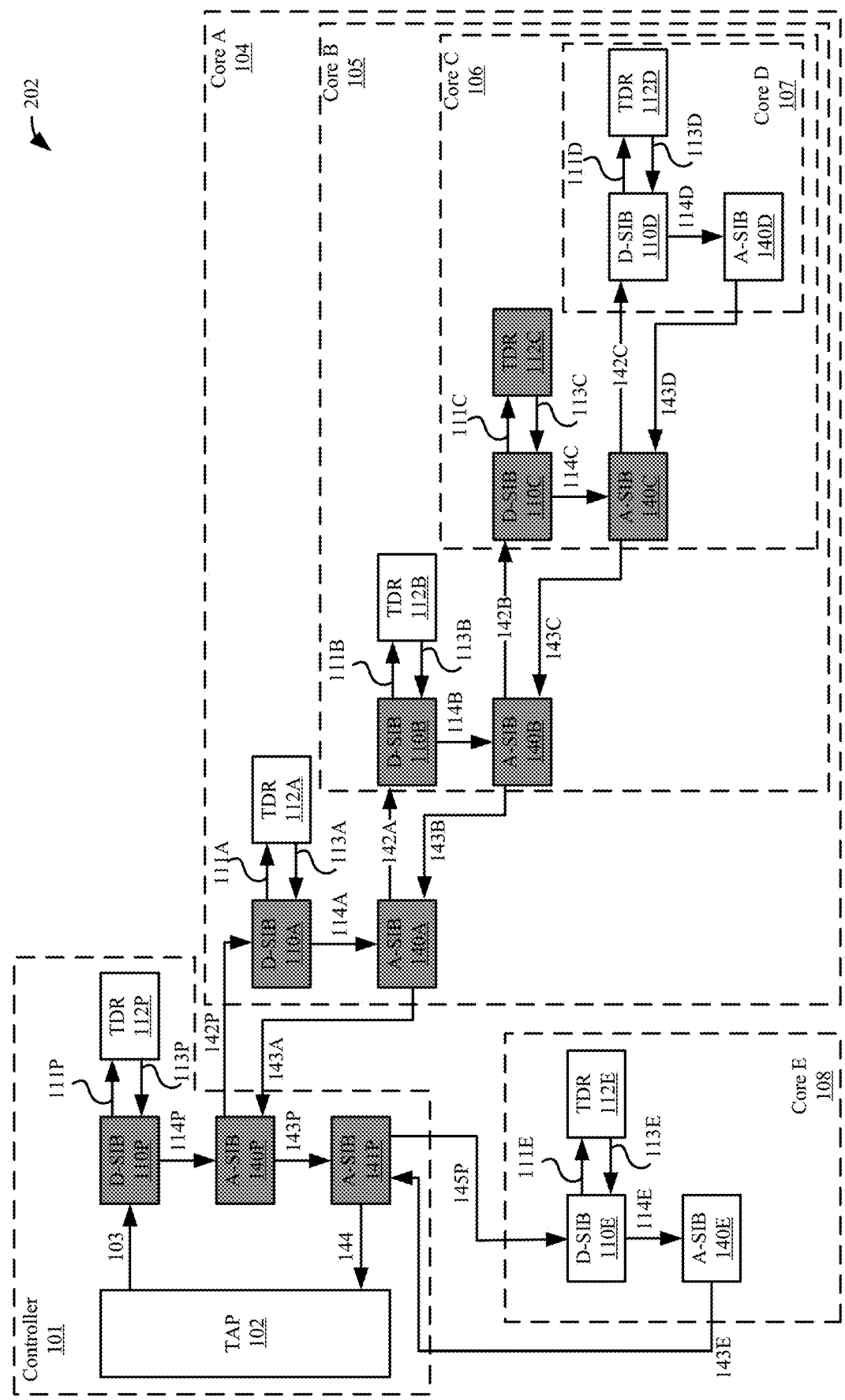
FIG. 2B depicts an example of the plurality of hierarchical electronic components that provides IJTAG access to the programmed TDR(s) according to one aspect of the present embodiments.

FIG. 2B depicts an example of plurality of hierarchical electronic components in the design 100 of FIG. 1A at the end of second iteration 202 according to one aspect of the present embodiments. In the second iteration 202 because all D-SIB and A-SIB registers are asserted in the IJTAG chain, then respective D-SIB and A-SIB registers can be programmed as desired. In this example, the goal may be to program TDR 112C. As such, D-SIB 110P is programmed with a 0 to prevent access to TDR 112P, A-SIB 140P is programmed with a 1 to provide access to A-SIB 140A and D-SIB 110A, D-SIB 110A is programmed with a 0 to prevent access to TDR 112A, A-SIB 140A is programmed with a 1 to provide access to D-SIB 110B and A-SIB 140B, D-SIB 110B is programmed with a 0 to prevent access to TDR 112B, A-SIB 140B is programmed with a 1 to provide access to D-SIB 110C and A-SIB 140C, D-SIB 110O is programmed with a 1 to provide access to TDR 112C so that TDR 112O can be programmed in subsequent iterations, A-SIB 140C may be programmed with a 0 to prevent access to its child hierarchical level (i.e. core D 107), and A-SIB 141P may be programmed with a 0 to prevent access to its child hierarchical level (i.e. core E 108). Accordingly, TDR 112C is coupled and provided access to at the end of the second iteration.

It is appreciated that the embodiments are described with respect to programming a 0 into A-SIB 140C and A-SIB 141P to save some clock cycles and for illustrative purposes. However, the embodiments are not limited thereto. For example, one may choose to forgo saving some clock cycles by programming a 1 into each A-SIB register in favor of simplicity.

Figure 2C:
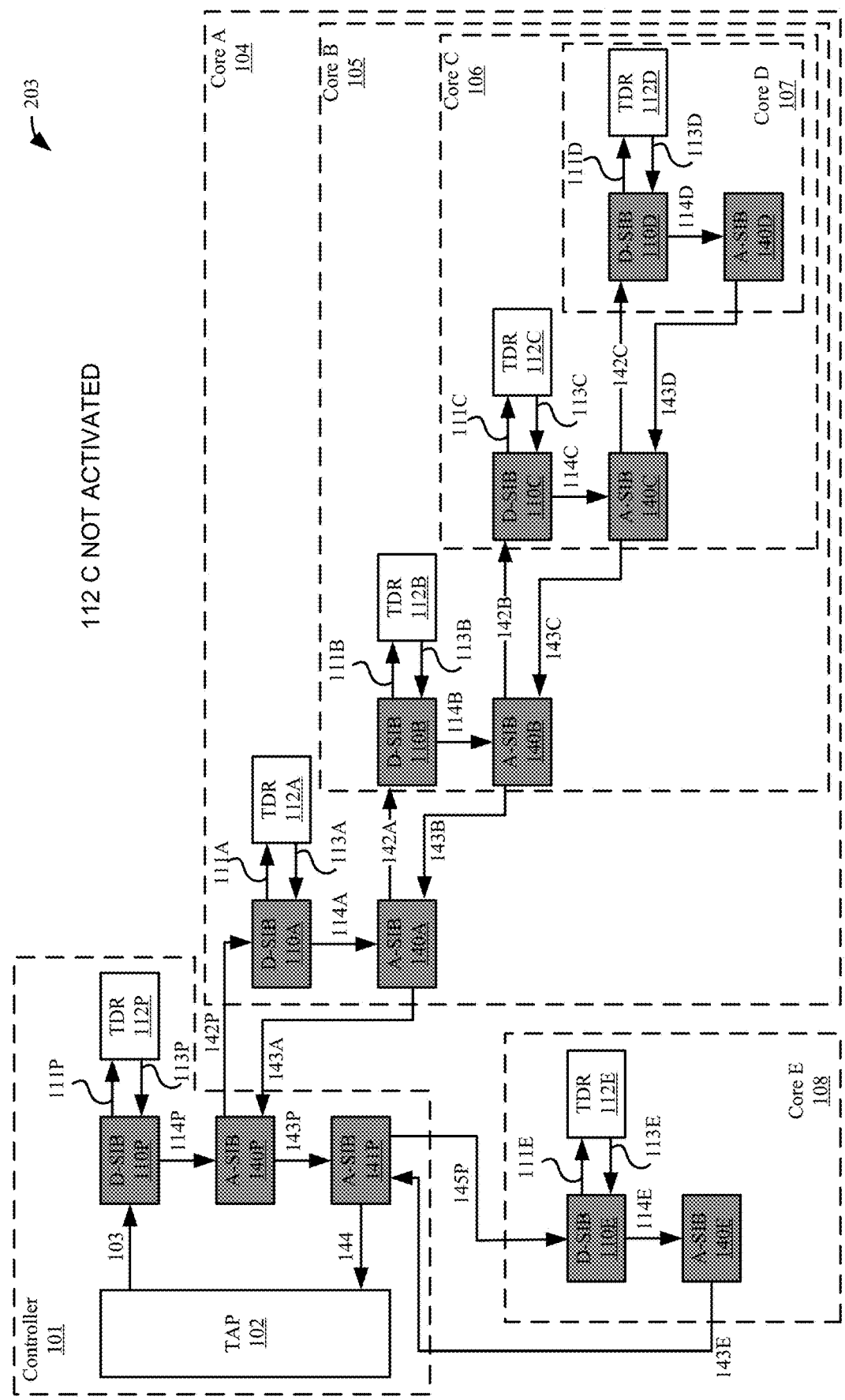
FIG. 2C depicts an example of plurality of hierarchical electronic components in a programming iteration according to one aspect of the present embodiments.

FIG. 2C depicts an example of the plurality of hierarchical electronic components in the design 100 of FIG. 1A at the end of third iteration 203 where the design is reverted back to its original state after programming TDR 112C according to one aspect of the present embodiments. In the third iteration 203, the desired TDR is programmed (here for illustrative purposes TDR 112C) and simultaneously removed from the IJTAG chain by programming D-SIB 110C to 0. It is appreciated that all the D-SIB registers and A-SIB registers in the design are asserted and coupled in chain by additionally programming A-SIB 140C and A-SIB 141P to 1. In this nonlimiting example, at the of third iteration D-SIB 110P, A-SIB 140P, A-SIB 141P, D-SIB 110A, A-SIB 140A, D-SIB 110B, A-SIB 140B, D-SIB 110C, A-SIB 140C, D-SIB 110D A-SIB 140D, D-SIB 110E, and A-SIB 140E become asserted and a readout data to TAP 102.

It is appreciated that the proposed architecture and use of D-SIB and A-SIB registers instead of SIB registers of the conventional method saves many iterations and clock cycles. For example, in the conventional system, on reset each hierarchical level is traversed. In contrast, in the first iteration the controller 110 (i.e. D-SIB 110P, A-SIB 140P, and A-SIB 141) are asserted and traversed. In the second iteration the next hierarchical level, e.g., core A 104, is asserted and traversed by asserting A-SIB 140P from controller 101. In the third iteration the next hierarchical level, e.g., core B 105, is asserted and traversed by asserting A-SIB 140P from controller 101 as well as asserting A-SIB 140A from core A 104. In the fourth iteration the next hierarchical level, e.g., core C 106, is asserted and traversed by asserting A-SIB 140P from controller 101 as well as asserting A-SIB 140A from core A 104 as well as asserting A-SIB 140B from core B 105. Since the TDR 112C is to be programmed, after four iterations one reaches it and can program the TDR in the fifth iteration. As such, the proposed approach save many iterations and clock cycles.

Figure 3:
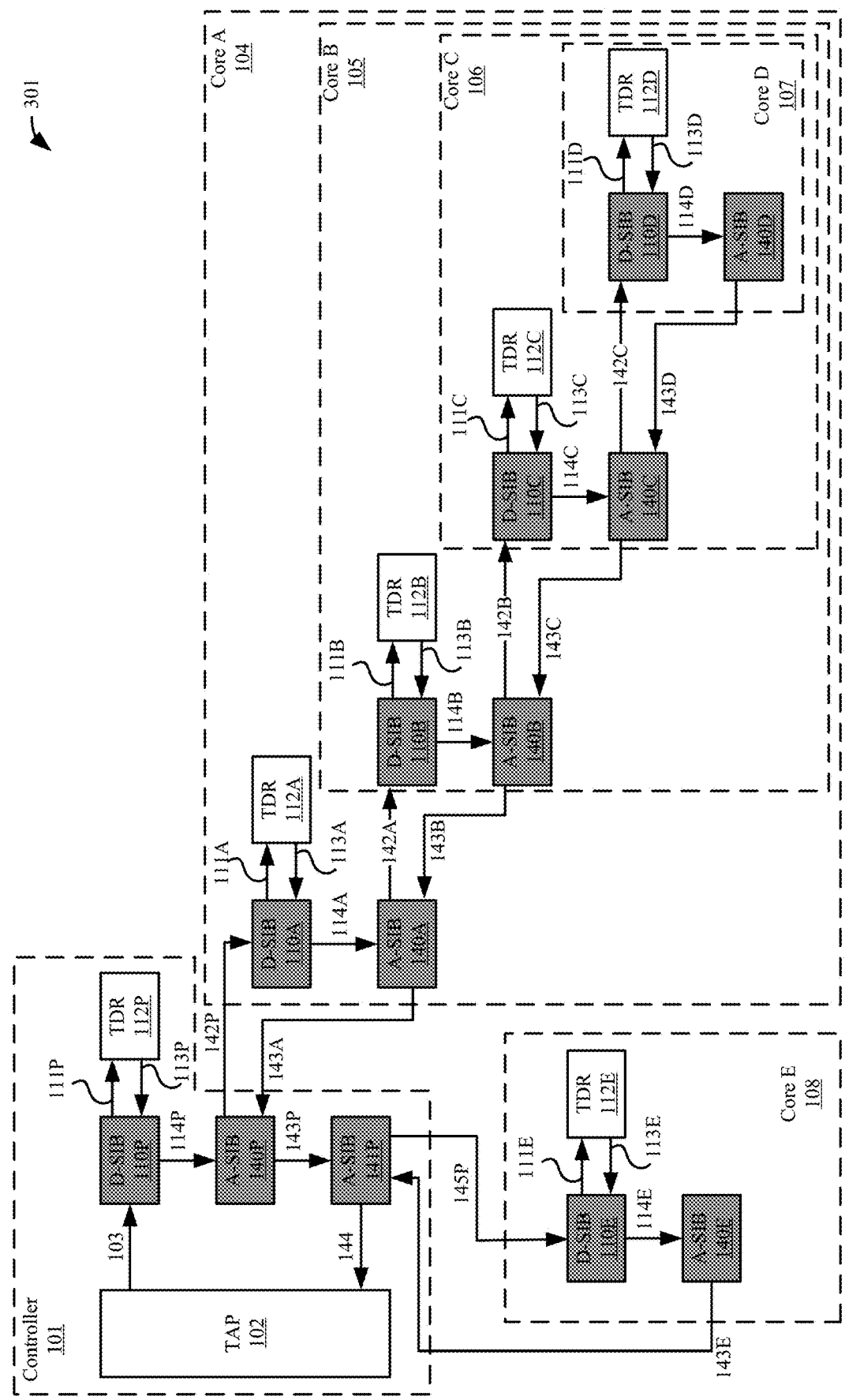
FIG. 3 depicts an example of a plurality of hierarchical electronic components at a first iteration for providing IJTAG access to one or more TDRs according to one aspect of the present embodiments.

FIG. 3 depicts an example of a plurality of hierarchical electronic components at the end of first iteration for providing IJTAG access to one or more TDRs according to one aspect of the present embodiments. FIG. 3 is the same hierarchical architecture of FIG. 1A in the first iteration where all D-SIB and A-SIB registers are asserted and coupled in IJTAG chain, as described above. FIGS. 4A-4N, 5A-5G, 6A-6D, and 7A-7D are nonlimiting examples for subsequent iterations after the A-SIBs and D-SIBs are asserted, as illustrated in FIG. 3, in order to program TDR 112O, to program TDR 112E, and to program TDR 112A in sequential order.

Figure 4A:
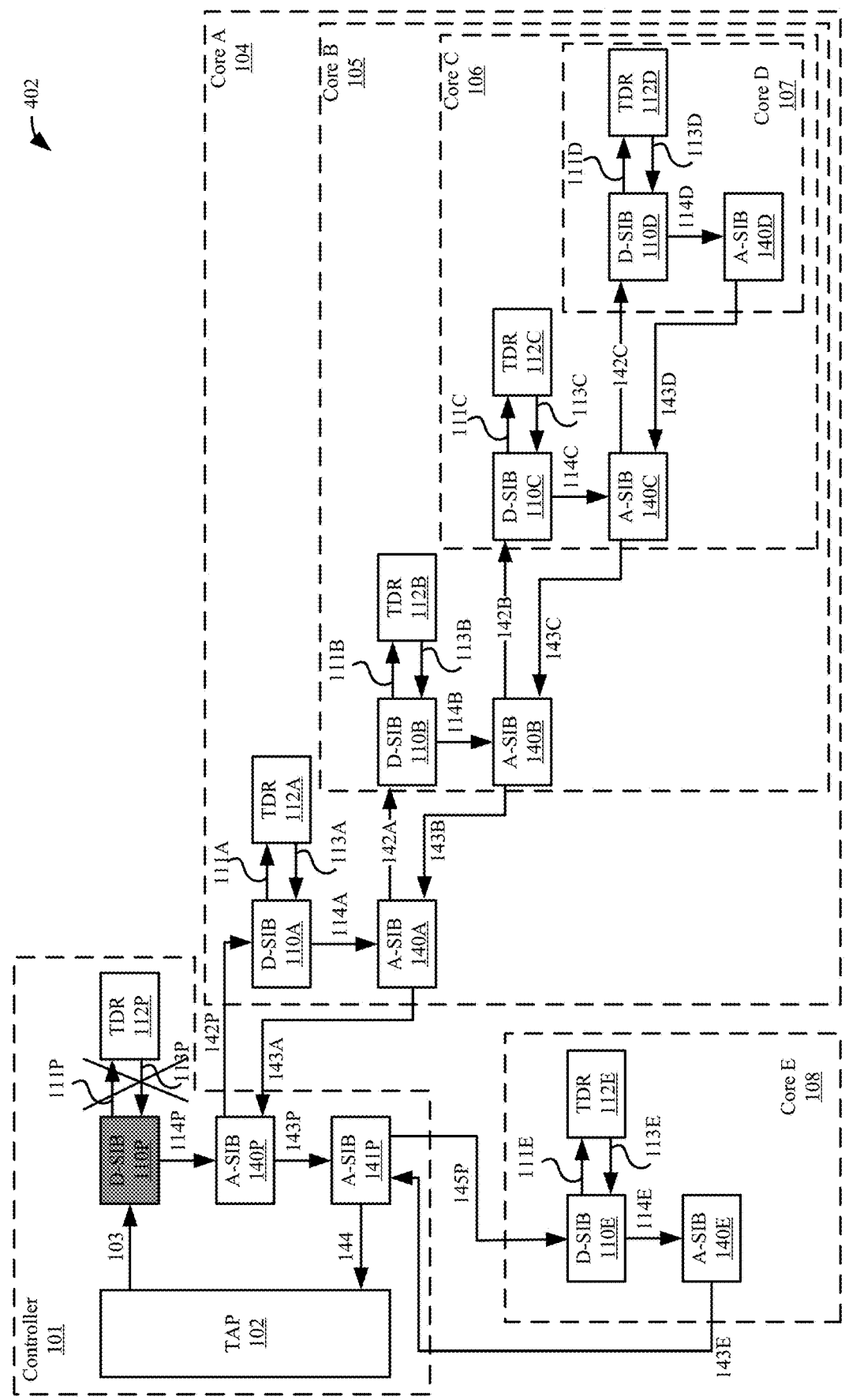
FIGS. 4A-4N depict an example of a plurality of hierarchical electronic components at a second iteration for providing IJTAG access to one or more TDRs according to one aspect of the present embodiments.
Figure 4B:
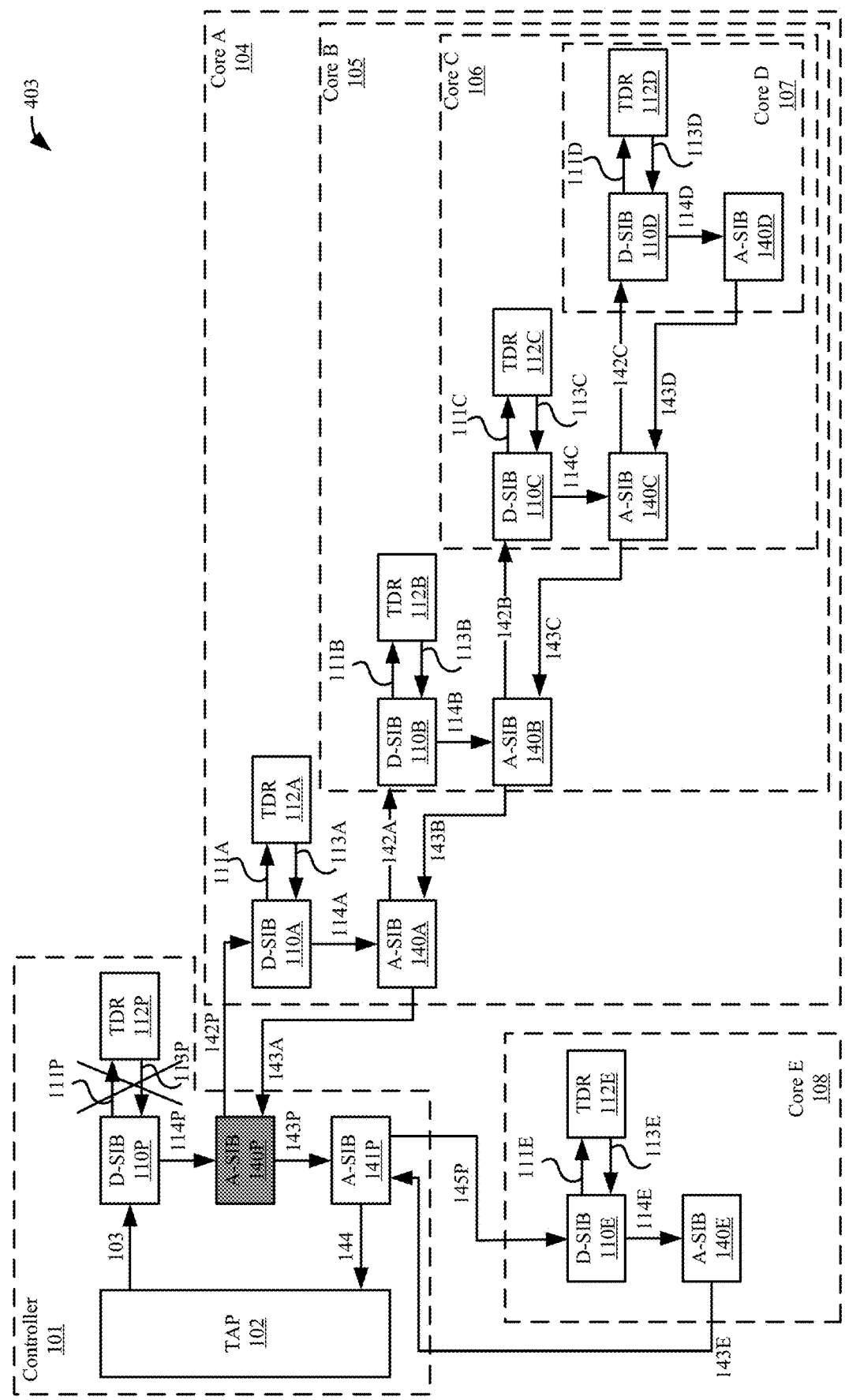
Figure 4C:
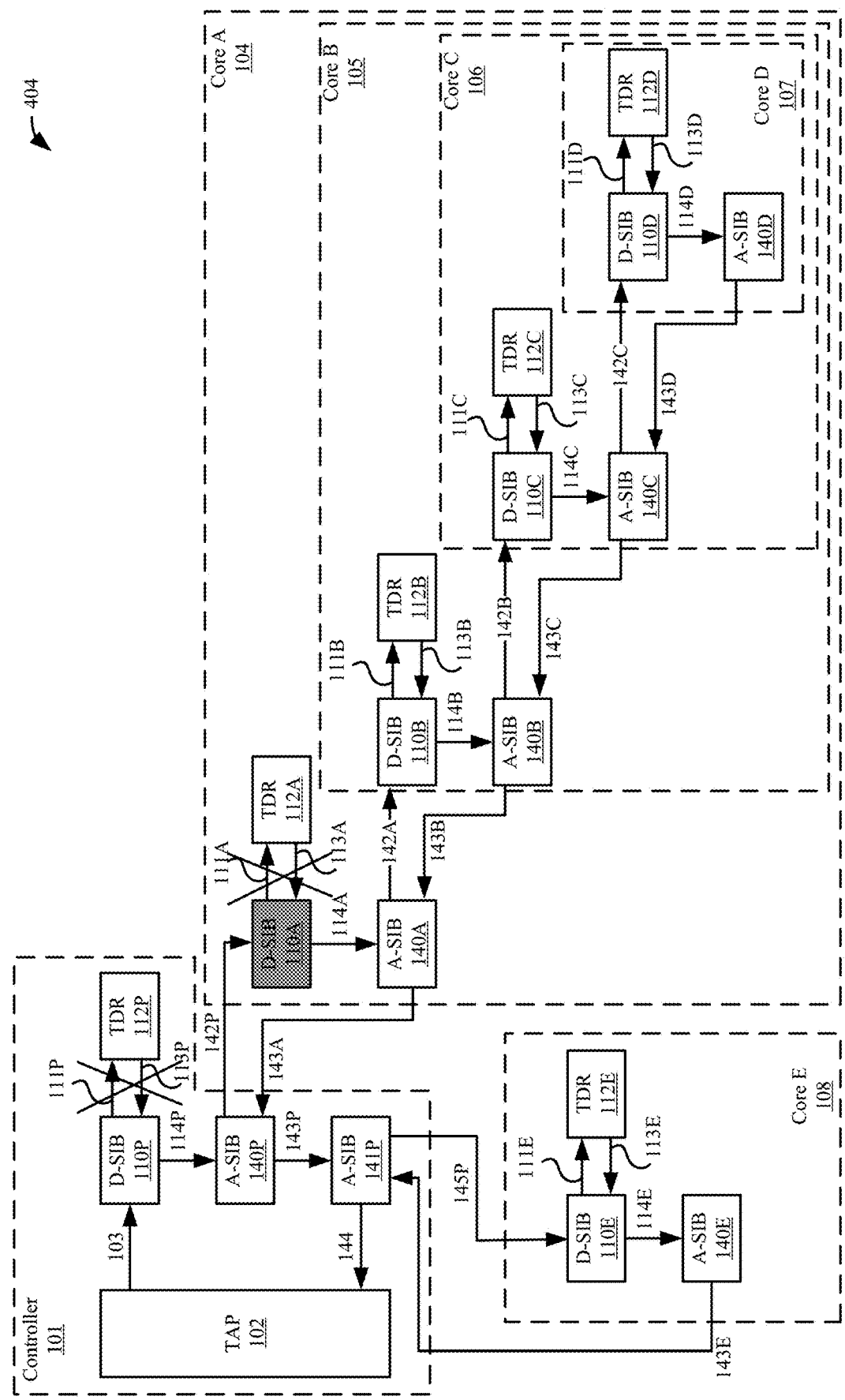
Figure 4D:
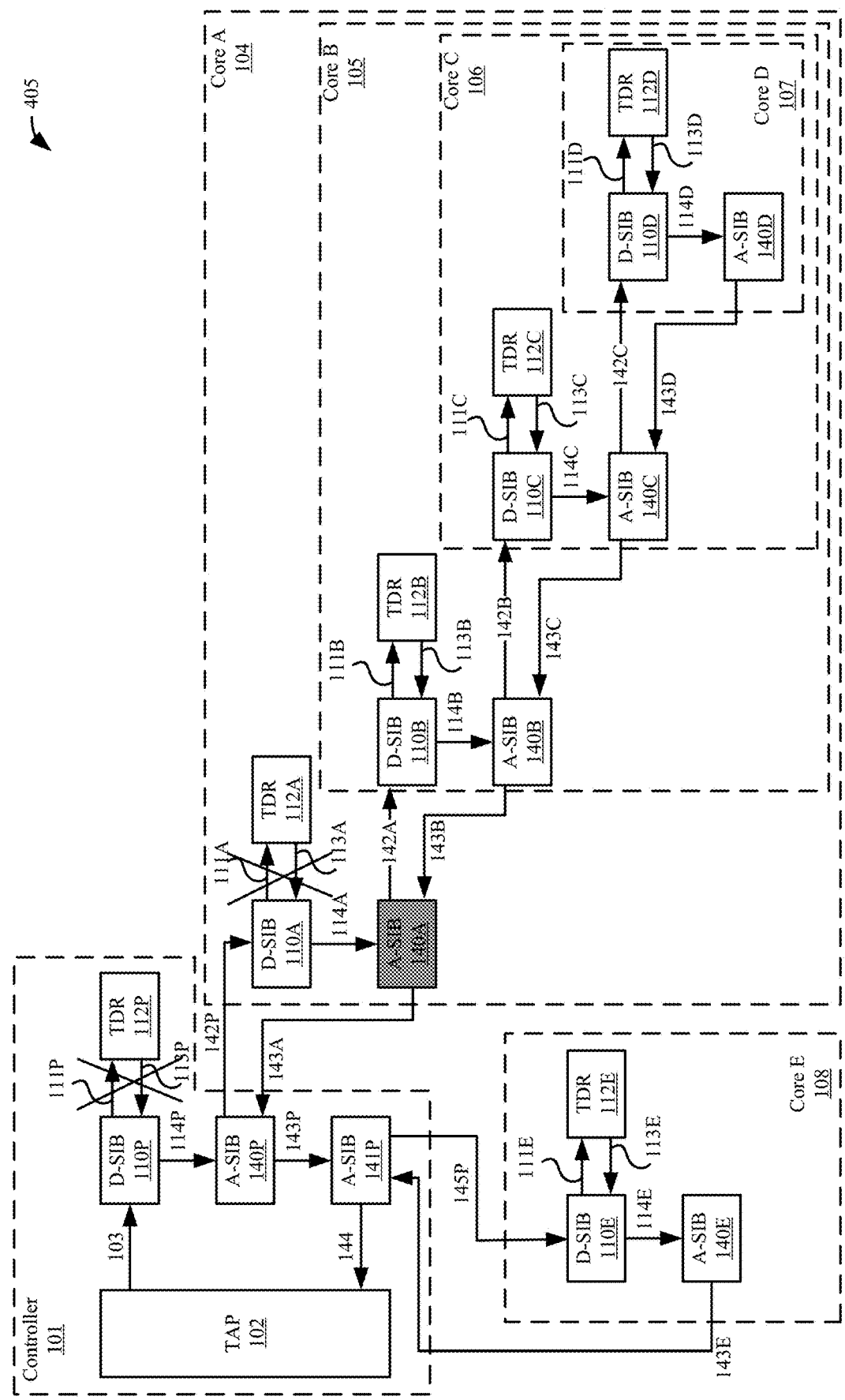
Figure 4E:
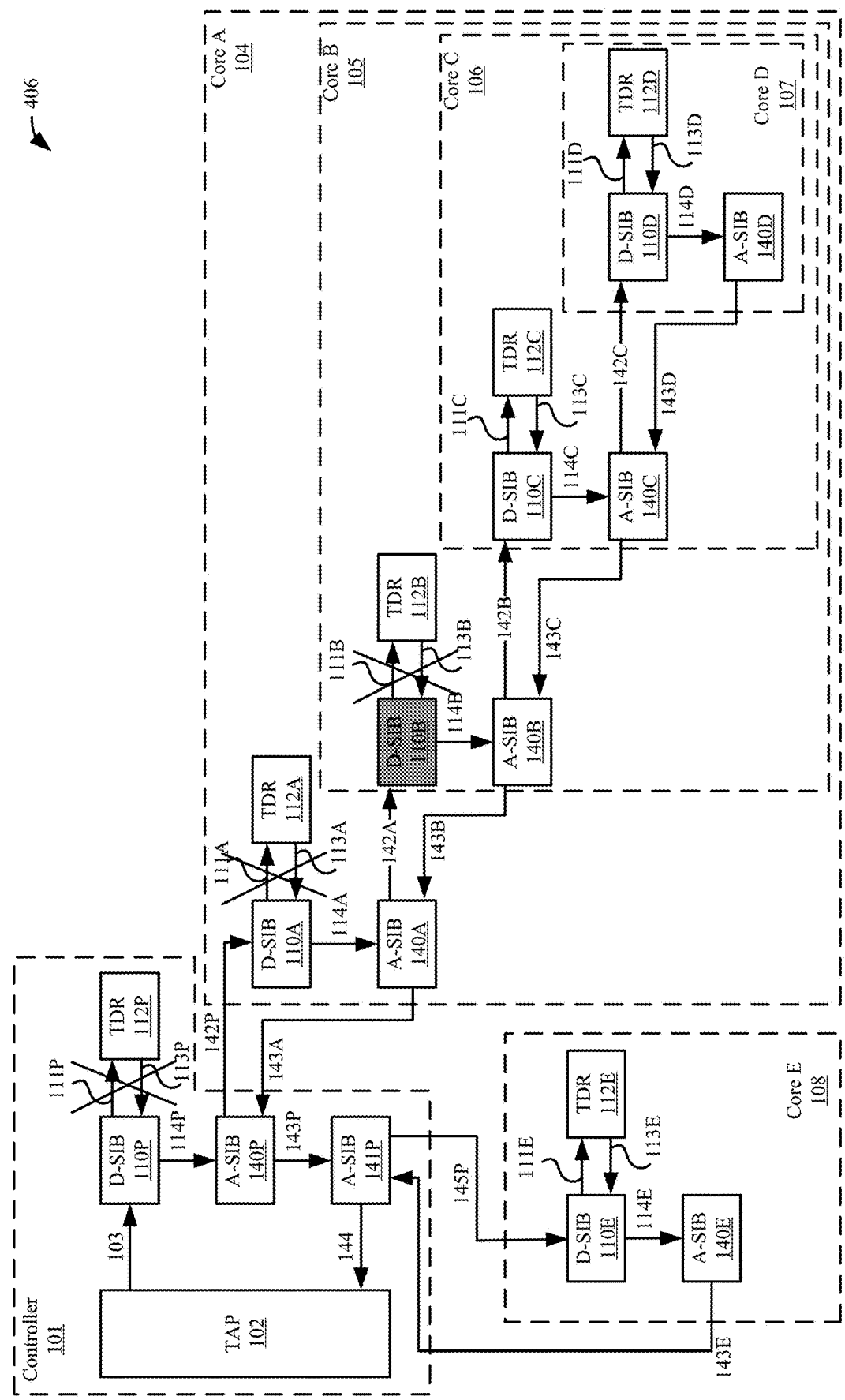
Figure 4F:
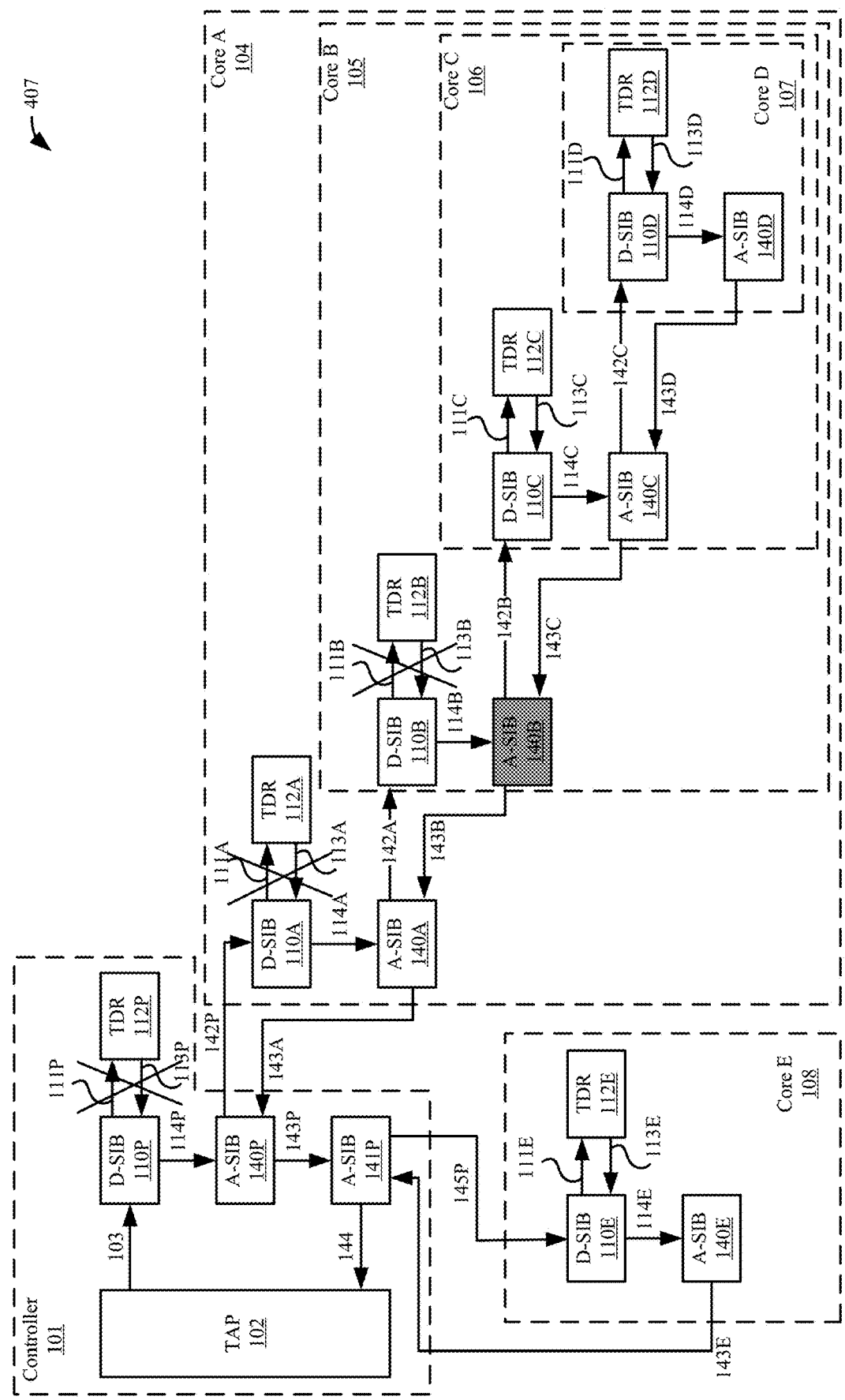
Figure 4G:
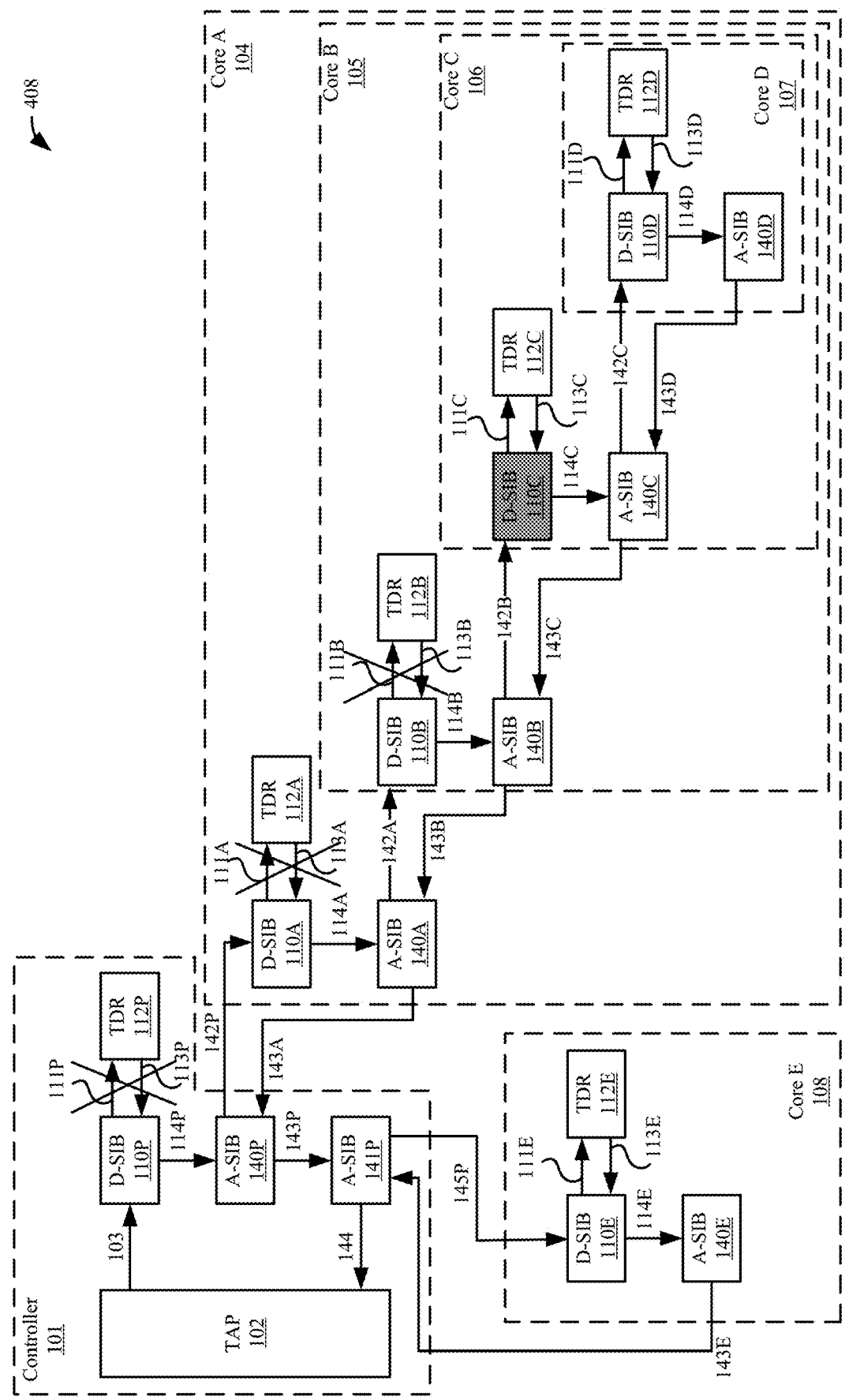
Figure 4H:
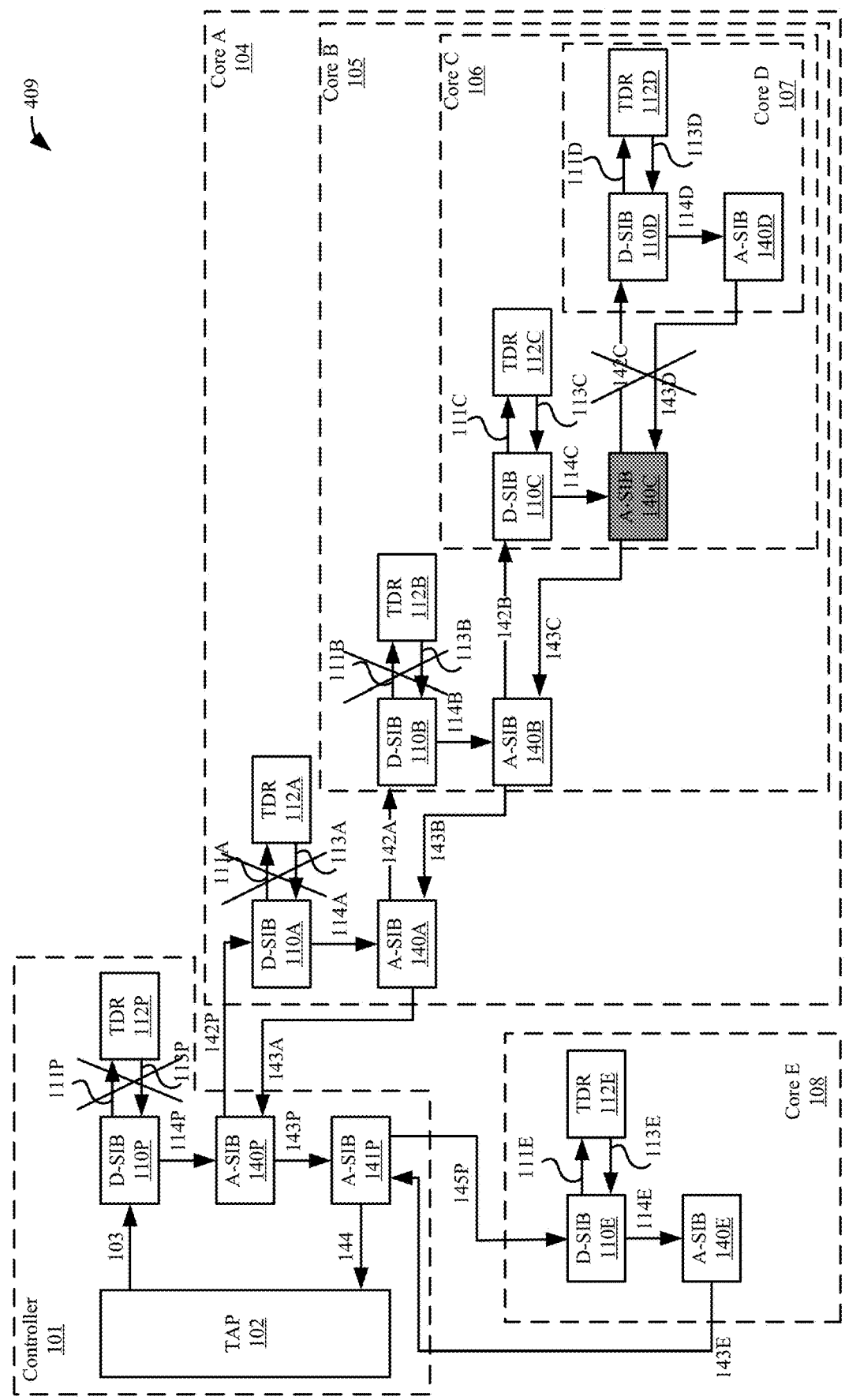
Figure 4I:
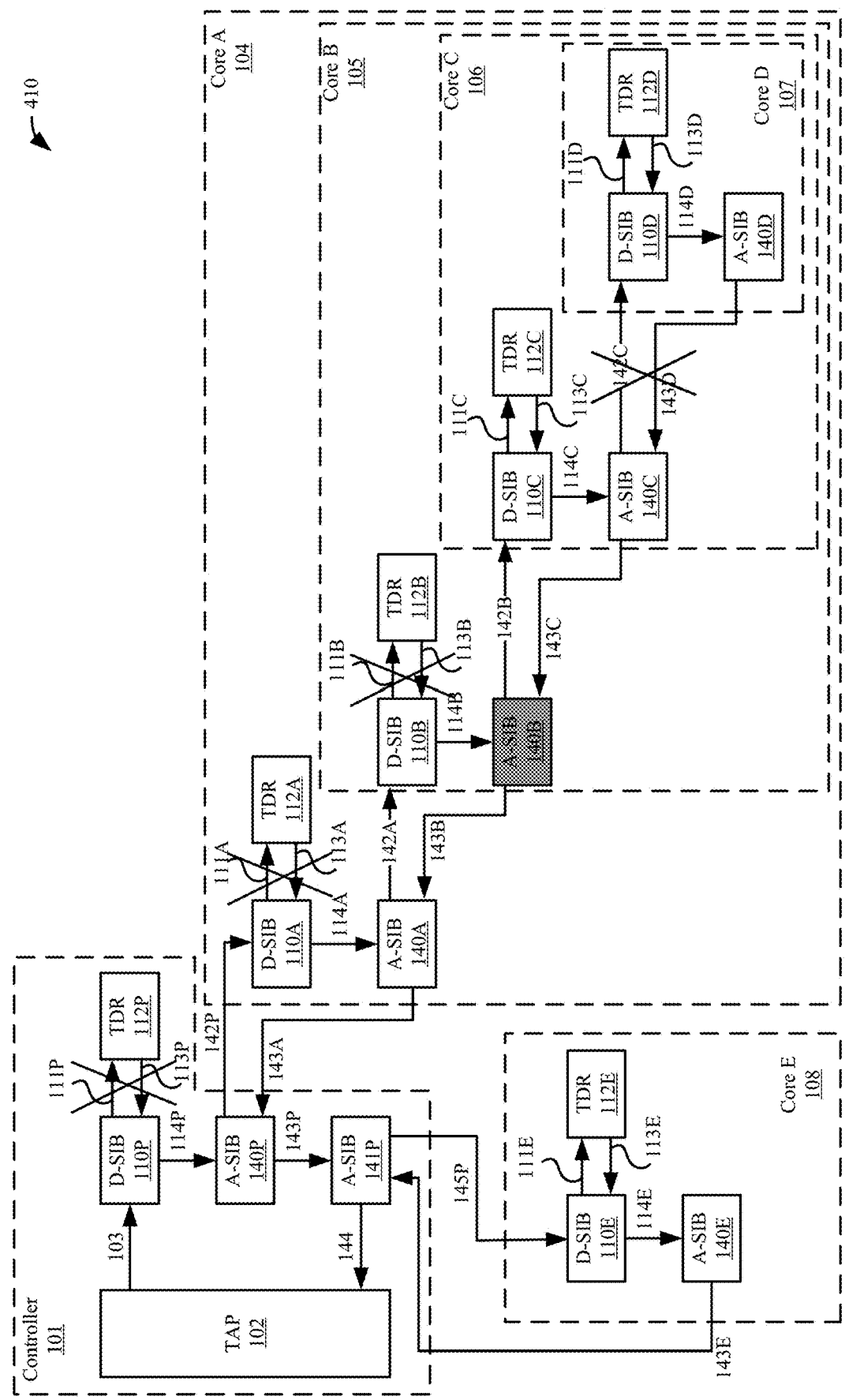
Figure 4J:
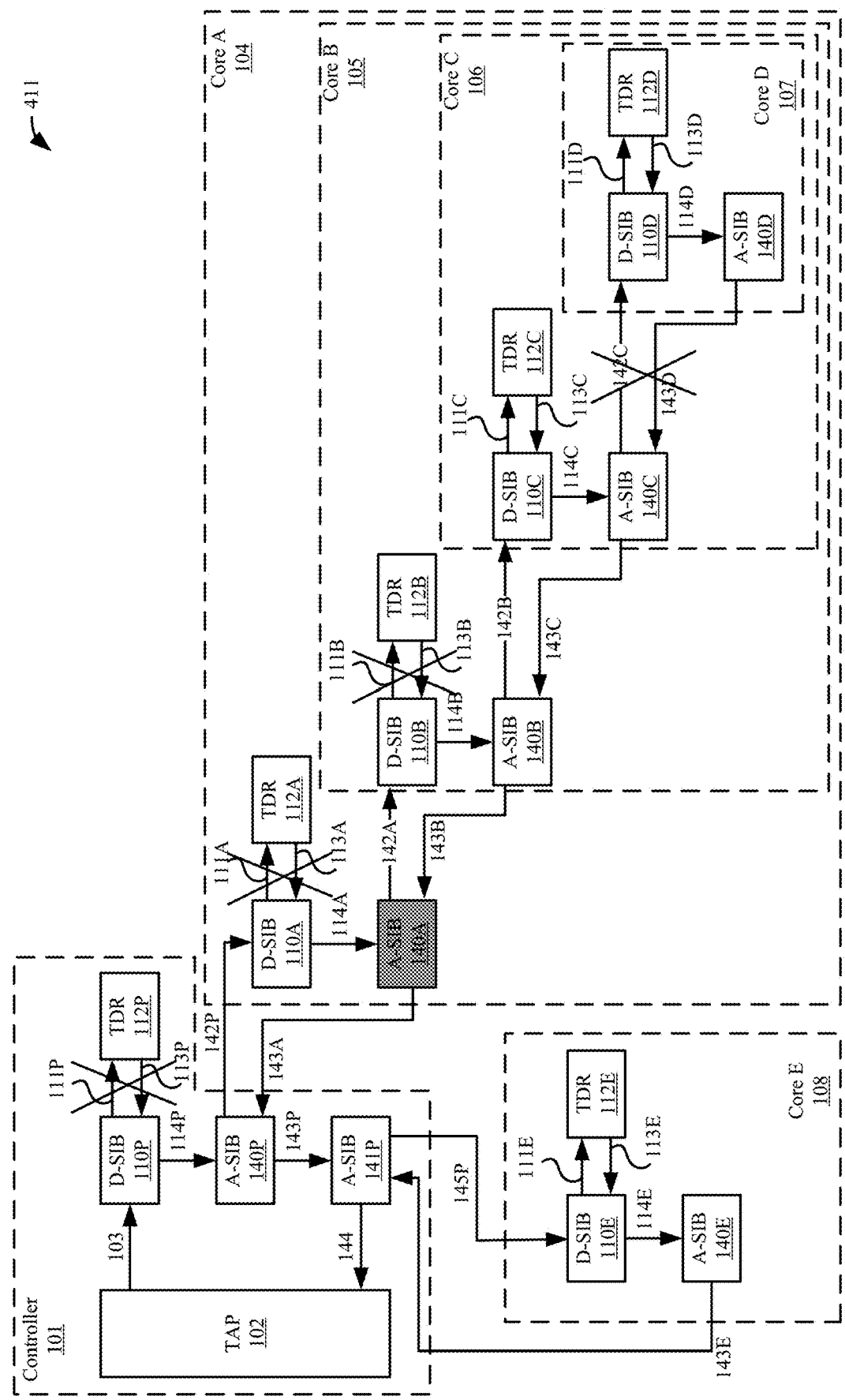
Figure 4K:
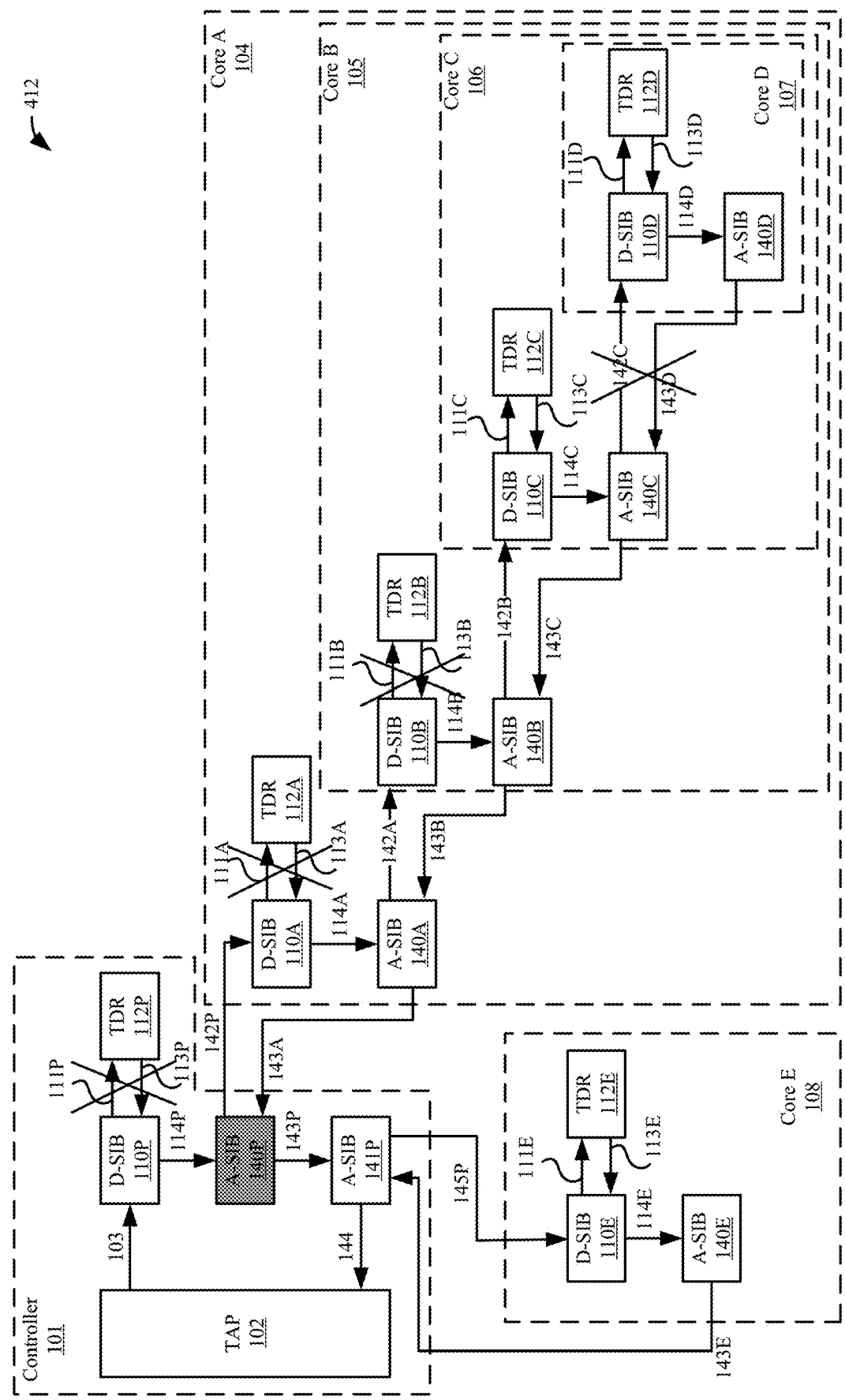
Figure 4L:
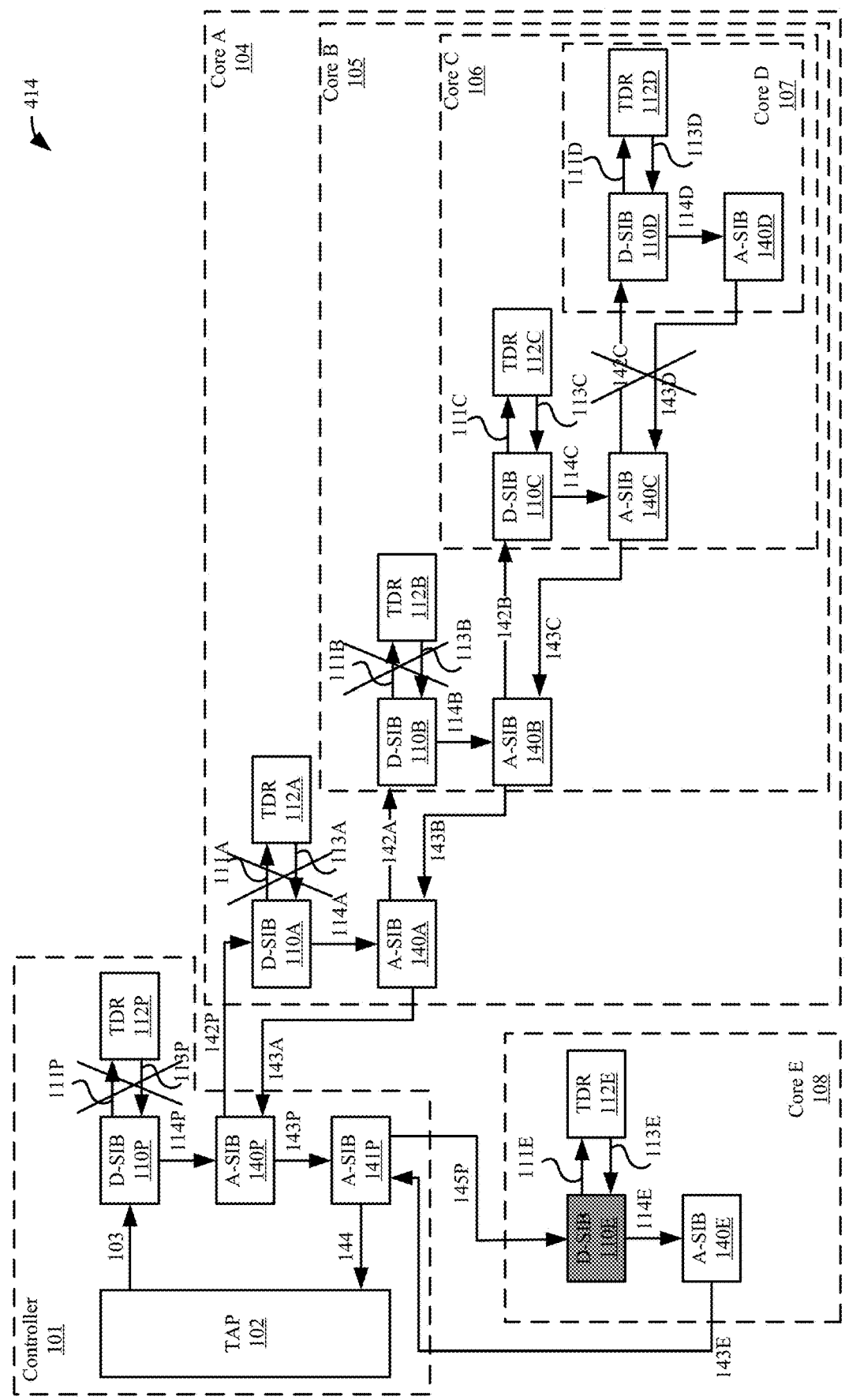
Figure 4M:
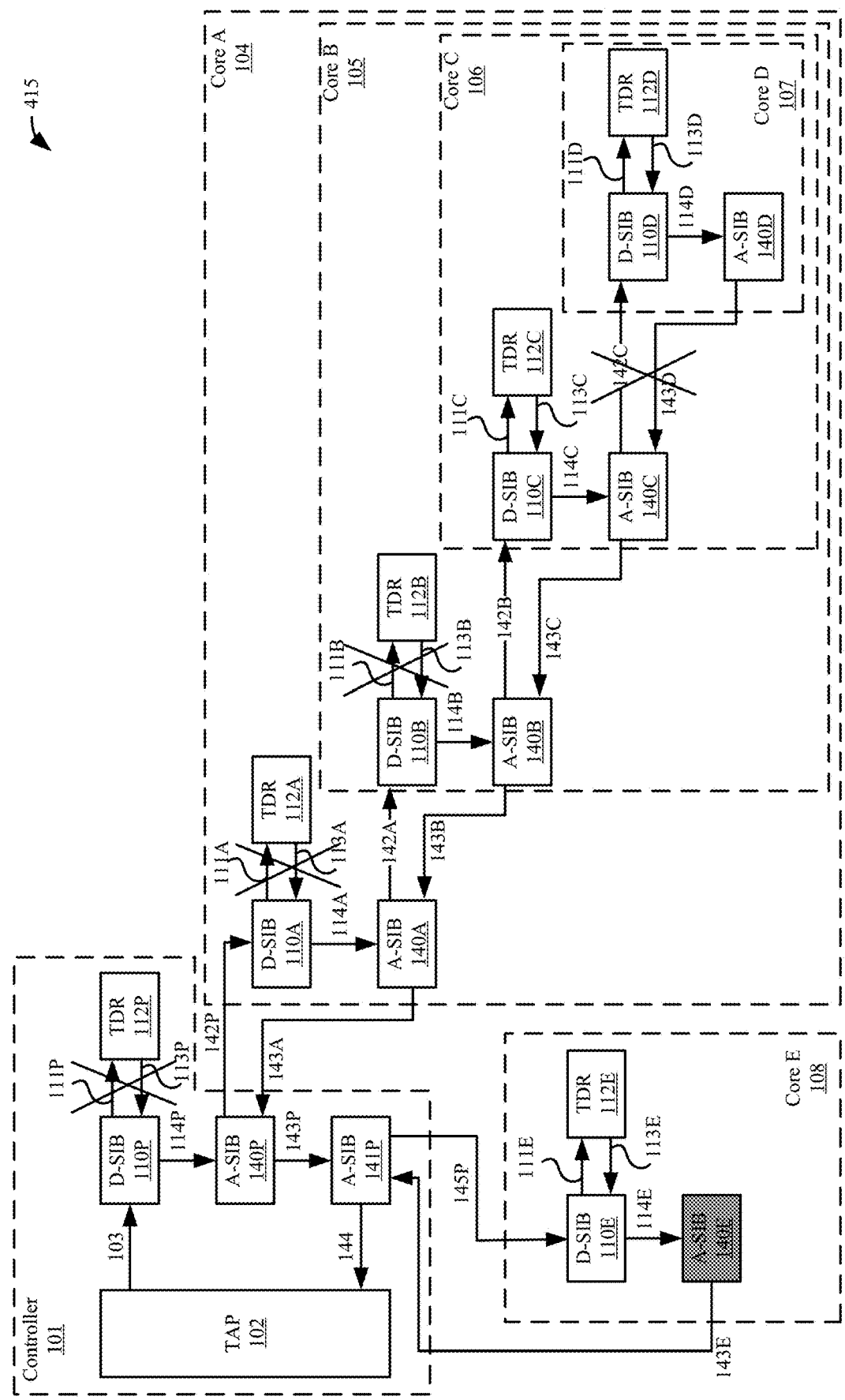
Figure 4N:
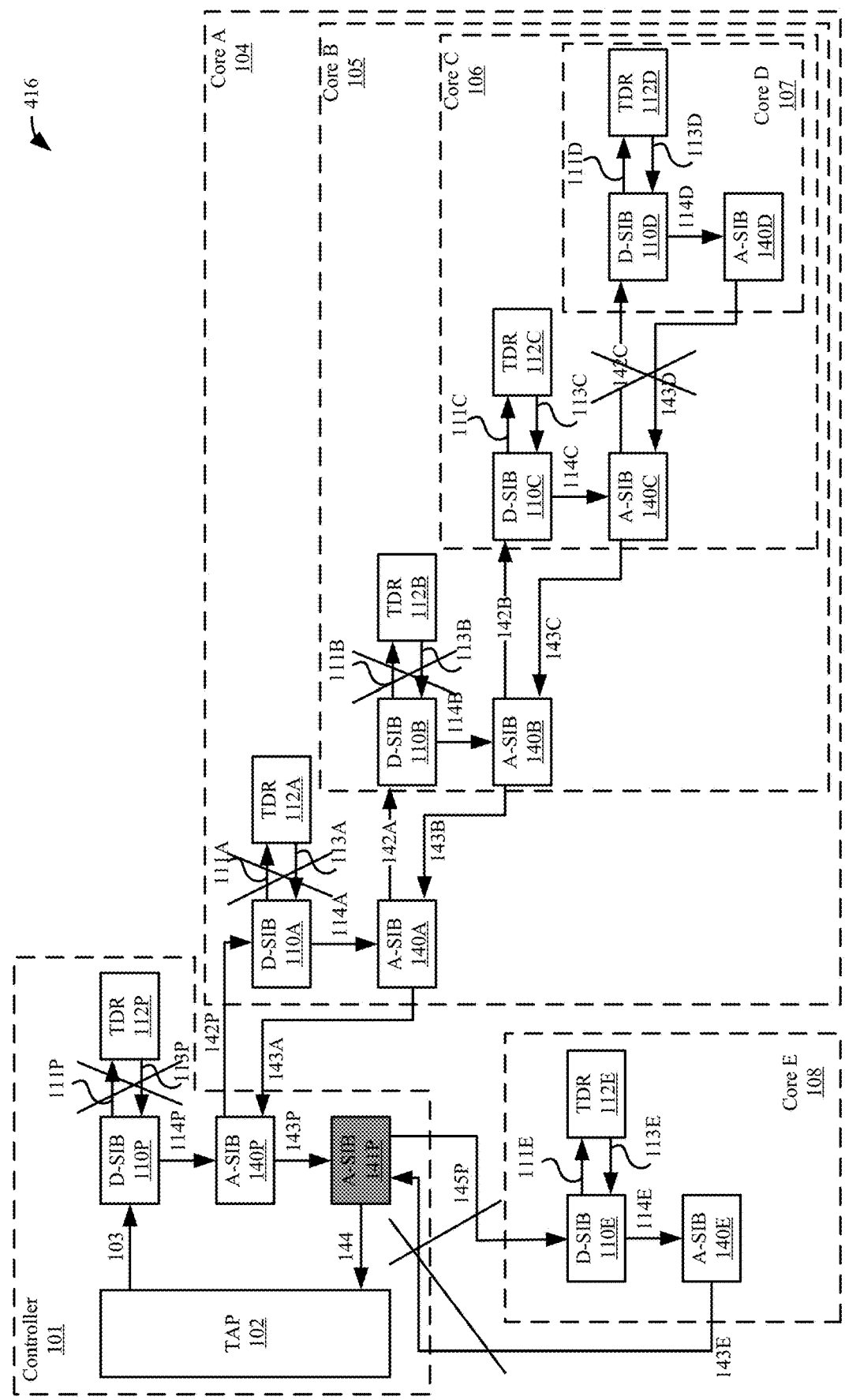

FIGS. 4A-4N depict an example of a plurality of hierarchical electronic components at the end of second iteration 405 for providing IJTAG access to one or more TDRs according to one aspect of the present embodiments. In the second iteration, since all A-SIBs and D-SIBs are asserted, they can be programmed to provide access to desired TDRs and/or other A-SIBs and D-SIBs. At time 402, data is shifted into the A-SIB and D-SIB registers one bit at a time to program the registers. In this nonlimiting example of FIG. 4A, D-SIB 110P of the controller 101 is programmed with a 0 to prevent access to its associated TDR 112P by shifting a 0 bit from tap 102 via connection 103 to D-SIB 110P. Referring now to FIG. 4B, at time 403, A-SIB 140P is programmed with a 1 (by shifting a 1 from D-SIB 110P to A-SIB 140P via connection 114P) to provide access to D-SIB 110A and A-SIB 140A via connections 142P. Referring now to FIG. 4C, at time 404, D-SIB 110A of core A 104 is programmed with a 0 (by shifting a 0 from A-SIB 140P to D-SIB 110A via connection 142P) to prevent access to its associated TDR 112A. In FIG. 4D, at time 405, A-SIB 140A is programmed with a 1 (by shifting a 1 from D-SIB 110A to A-SIB 140A via connection 114A) to provide access to D-SIB 110B and A-SIB 140B. In FIG. 4E, at time 406, D-SIB 110B is programmed with a 0 (by shifting a 0 from A-SIB 140A to D-SIB 110B via connection 142A) to prevent access to TDR 112B. In FIG. 4F, at time 407, A-SIB 140B is programmed with a 1 (by shifting a 1 from D-SIB 110B to A-SIB 140B via connection 114B) to provide access to D-SIB 110C and A-SIB 140C. In FIG. 4G, at time 408, D-SIB 110C is programmed with a 1 (by shifting a 1 from A-SIB 140B to D-SIB 110C via connection 142B) to provide access to its associated TDR 112C via connection 111C, in the next iteration. In FIG. 4H, at time 409, A-SIB 140C is programmed with a 0 (by shifting a 0 from D-SIB 110C to A-SIB 140C via connection 114C) to prevent access to D-SIB 110D and A-SIB 140D since no TDR in any of the child hierarchical levels are being programmed. In other words, by preventing access to the child of A-SIB 140C, several clock cycles may be saved.

In some embodiments, data is shifted back out from the child to the parent in a sequential manner. For example, in the example of FIGS. 4I-4K, data is shifted through, one bit at a time (i.e. time 410-412), from A-SIB 140C to A-SIB 140B to A-SIB 140A and back to A-SIB 140P via connections 143C, 143B and 143A respectively. It is appreciated that each A-SIB is also programmed in a sequential manner. In this nonlimiting example, A-SIB 140C is programmed with a 0, A-SIB 140B is programmed with a 1, A-SIB 140A is programmed with a 1, and A-SIB 140P is programmed with a 1.

In the example of FIG. 4L, at time 414, D-SIB 110E is programmed with a 1 by shifting a 1 from A-SIB 141P to D-SIB 110E to provide access to the associated TDR 112E via connection 111E, in subsequent iteration(s).

In the example of FIG. 4M, at time 415, A-SIB 140E can be programmed with any value via connection 114E since it does not have a child network. In FIG. 4N, at time 415, A-SIB 141P is programmed with a 0 by shifting a 0 from A-SIB 140E to A-SIB 141P in order to prevent access to core E 108 at the next iteration.

FIGS. 5A-5G depict an example of a plurality of hierarchical electronic components at the end of third iteration for providing IJTAG access to one or more TDRs according to one aspect of the present embodiments. It is appreciated that during the third iteration the data and programming traverses through TAP 102 to D-SIB 110P to A-SIB 140P to D-SIB 110A to A-SIB 140A to D-SIB 110B to A-SIB 140B to D-SIB 110C to TDR 112C to D-SIB 110C to A-SIB 140C to A-SIB 140B to A-SIB 140A to A-SIB 140P to A-SIB 141P back to the tap 102 in order to program the components that the data is traversing through.

Figure 5A:
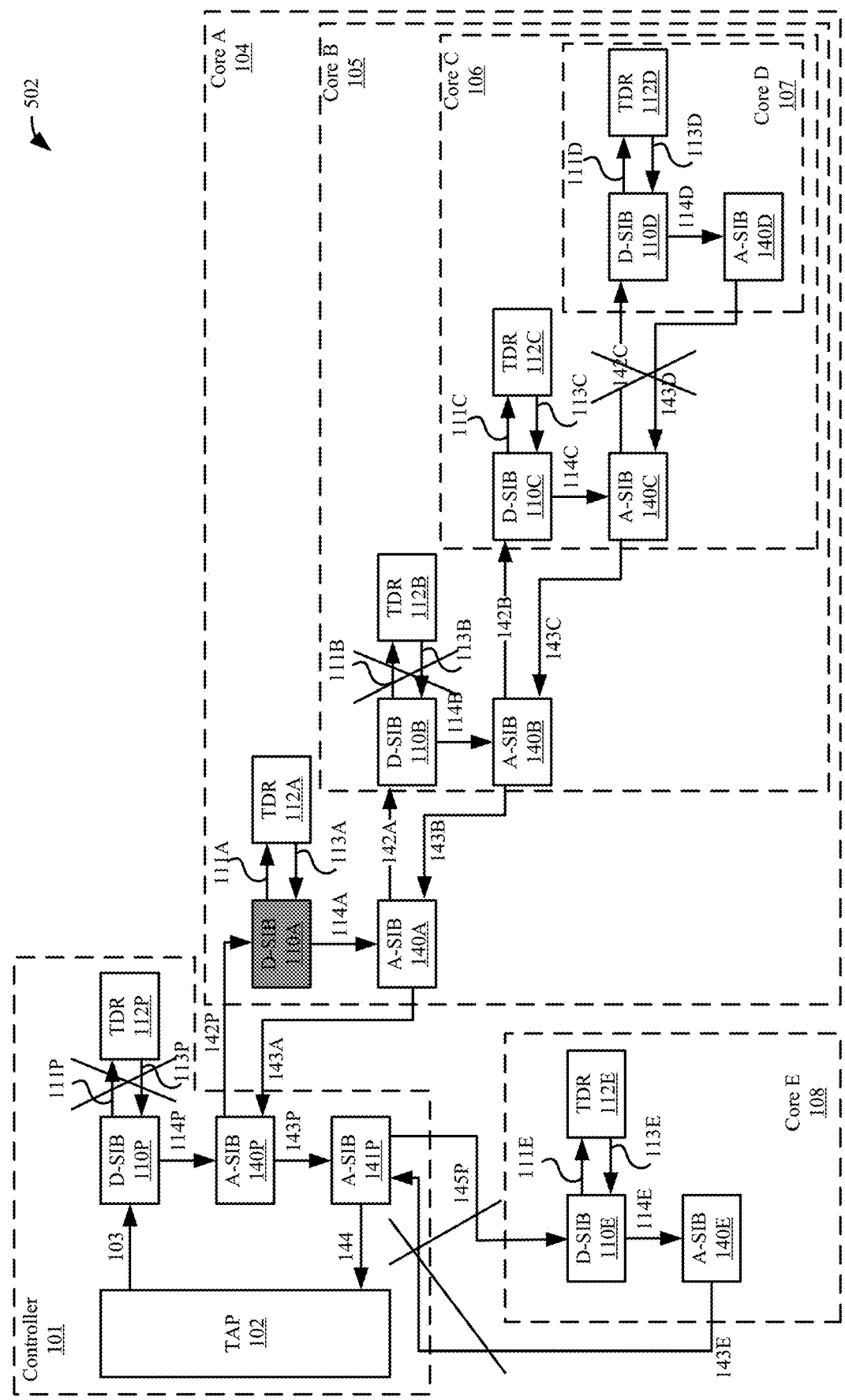
FIGS. 5A-5G depict an example of a plurality of hierarchical electronic components at a third iteration for providing IJTAG access to one or more TDRs according to one aspect of the present embodiments.
Figure 5B:
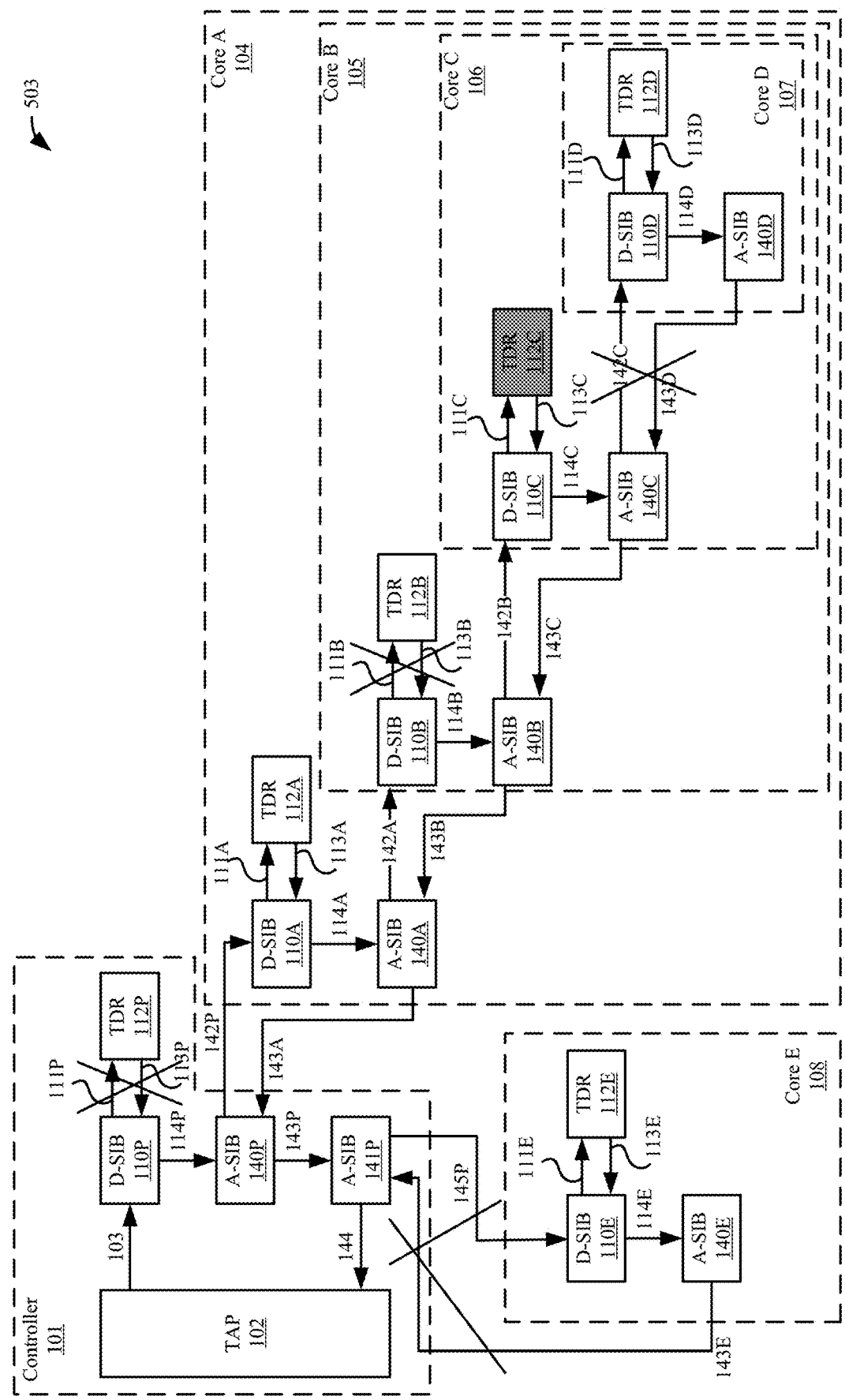
Figure 5C:
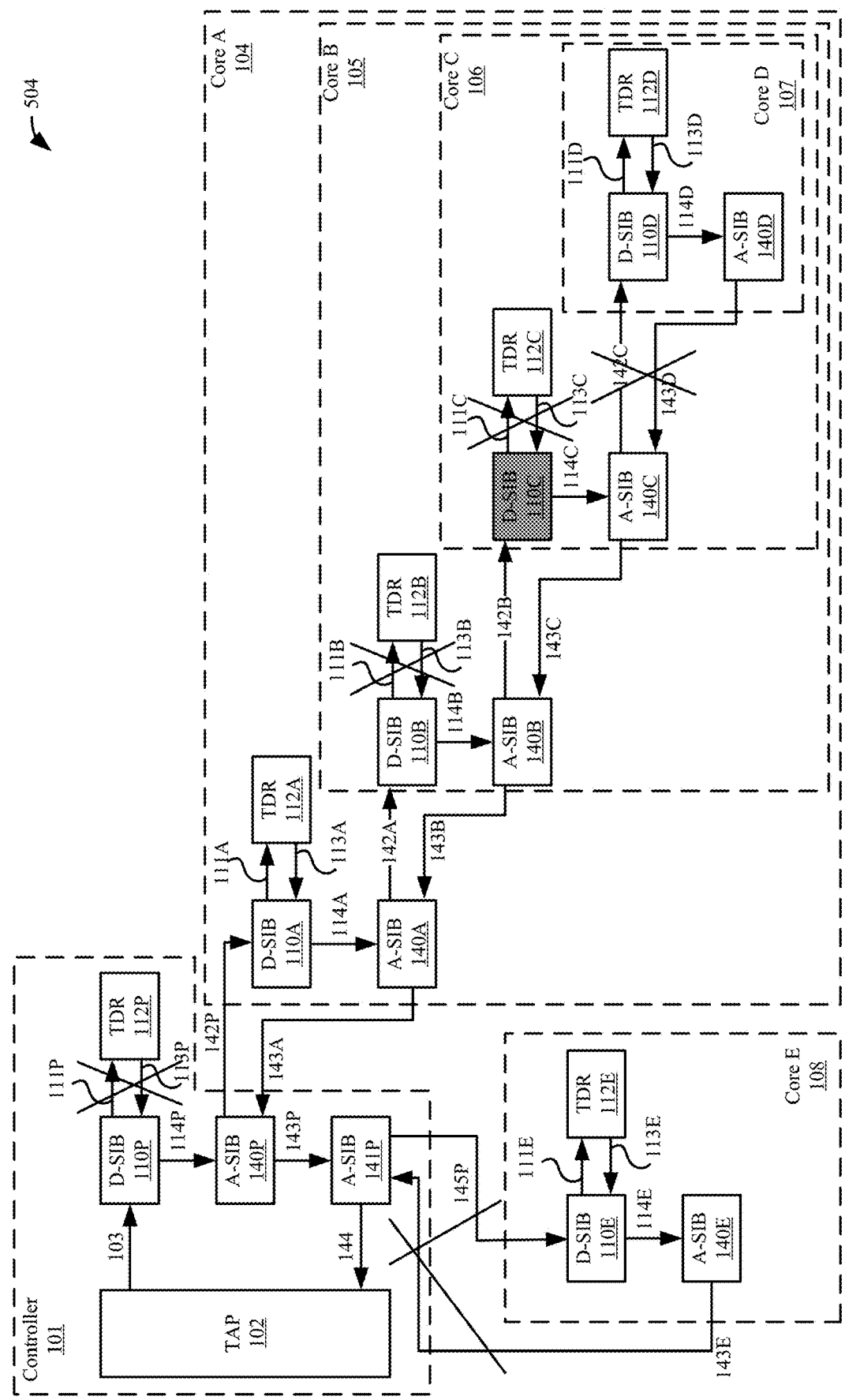
Figure 5D:
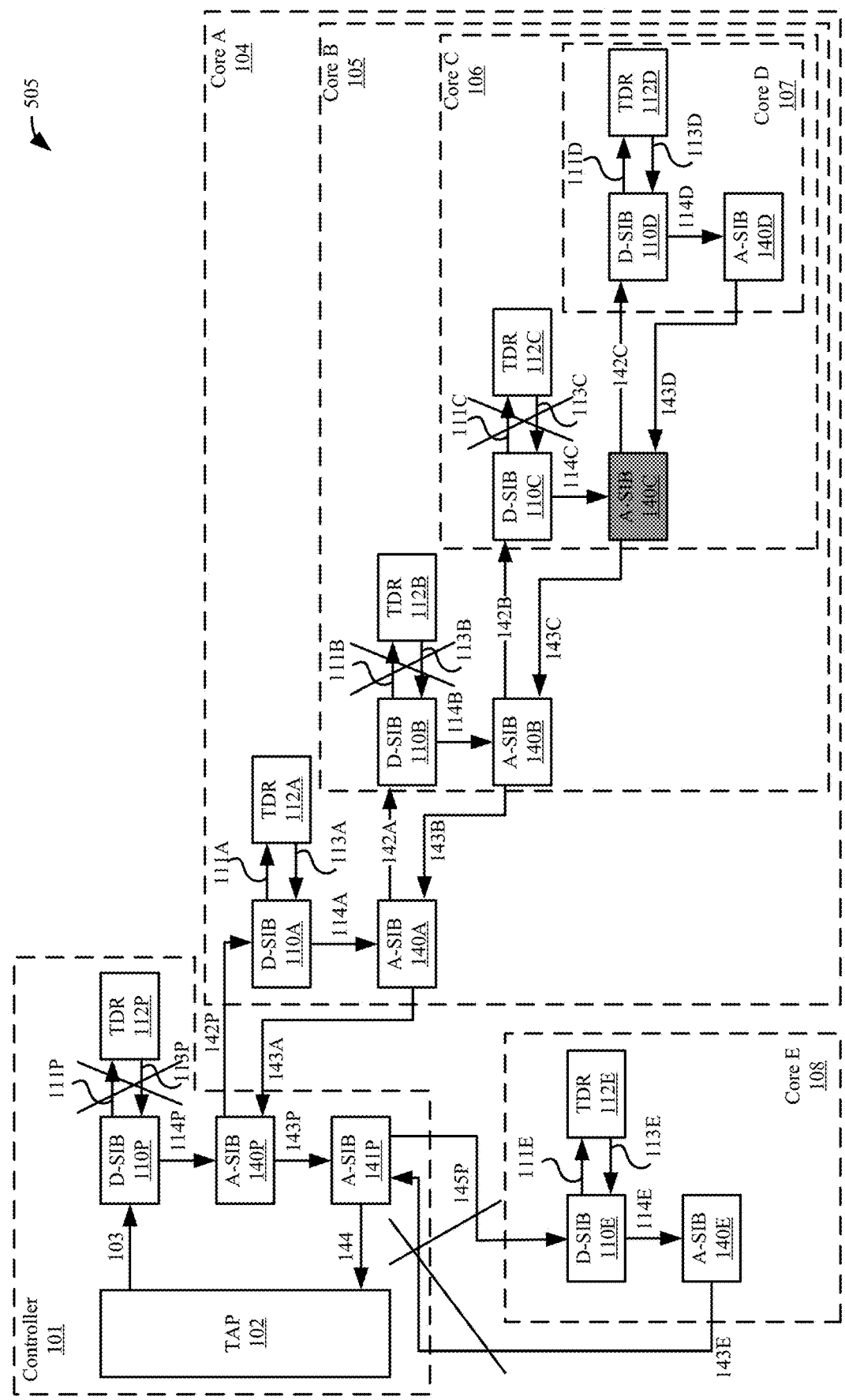
Figure 5E:
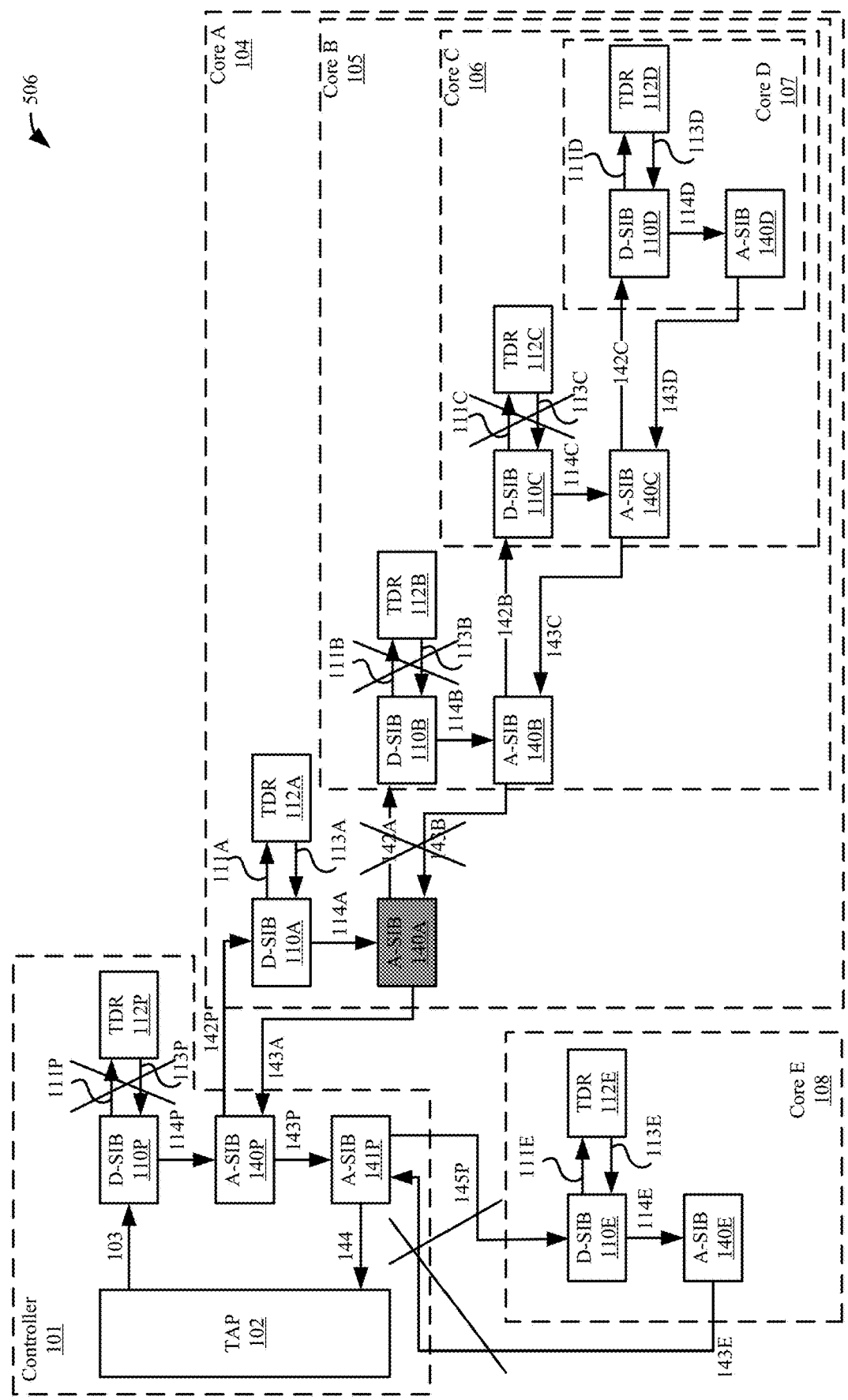
Figure 5F:
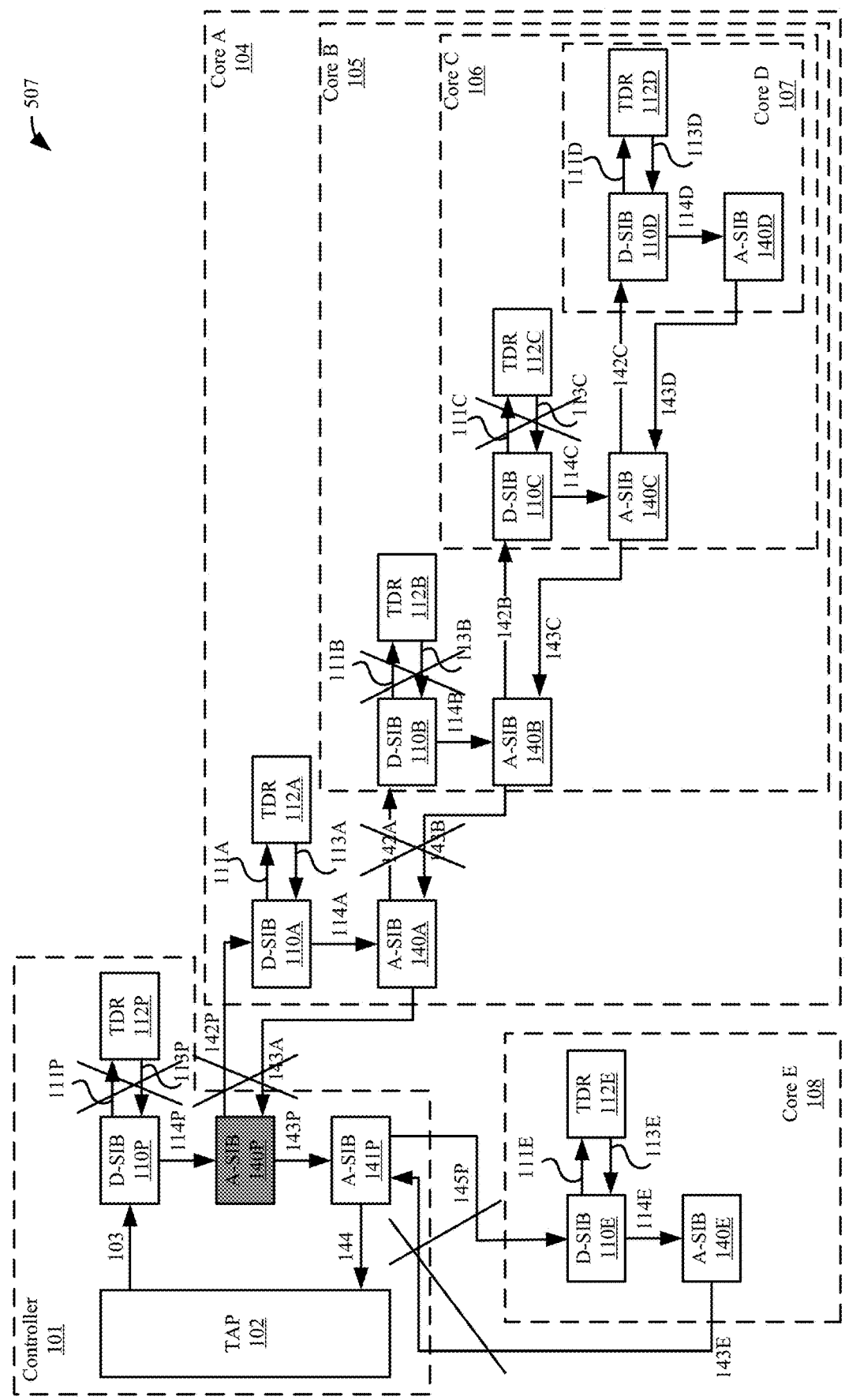
Figure 5G:
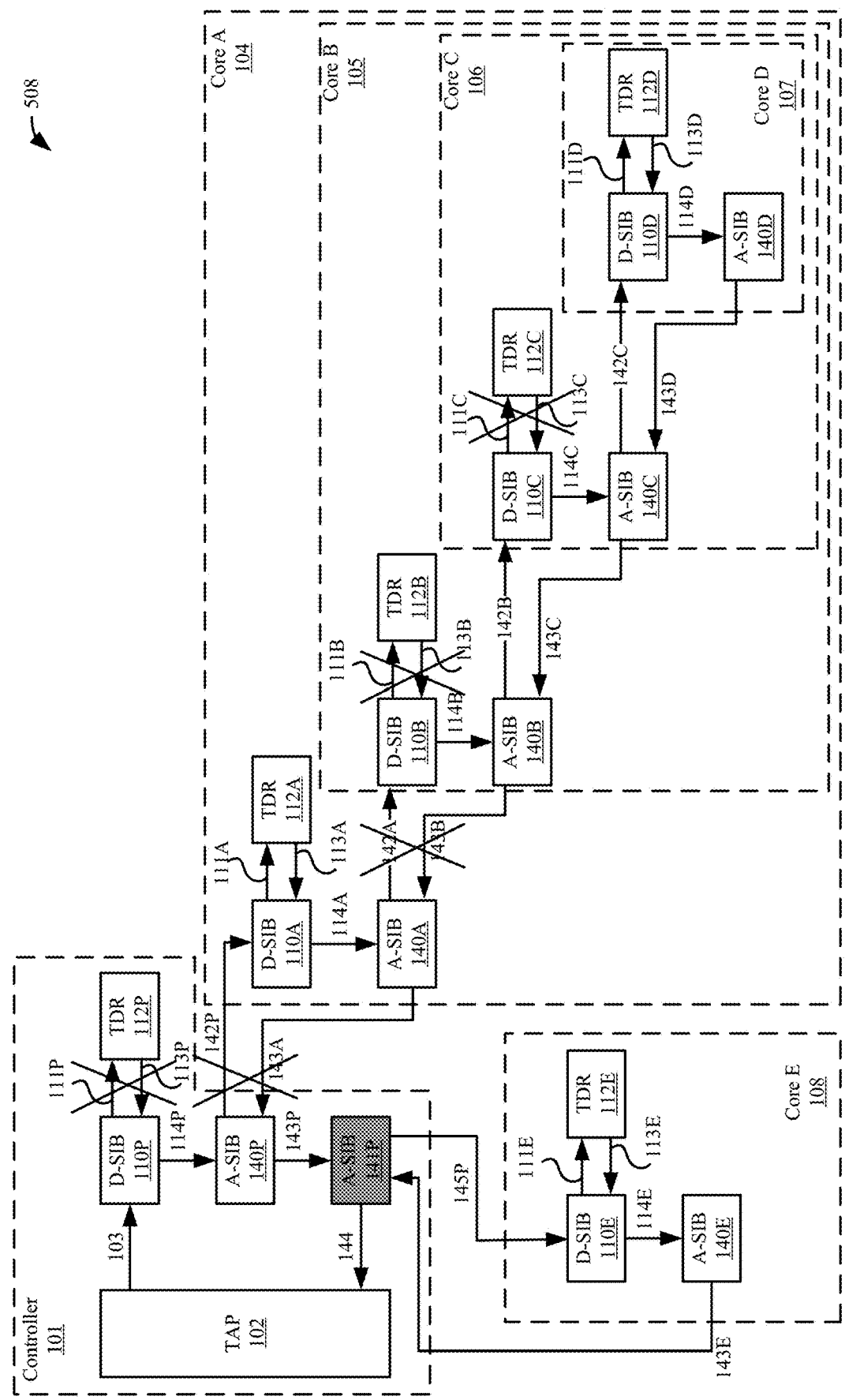
Figure 9:
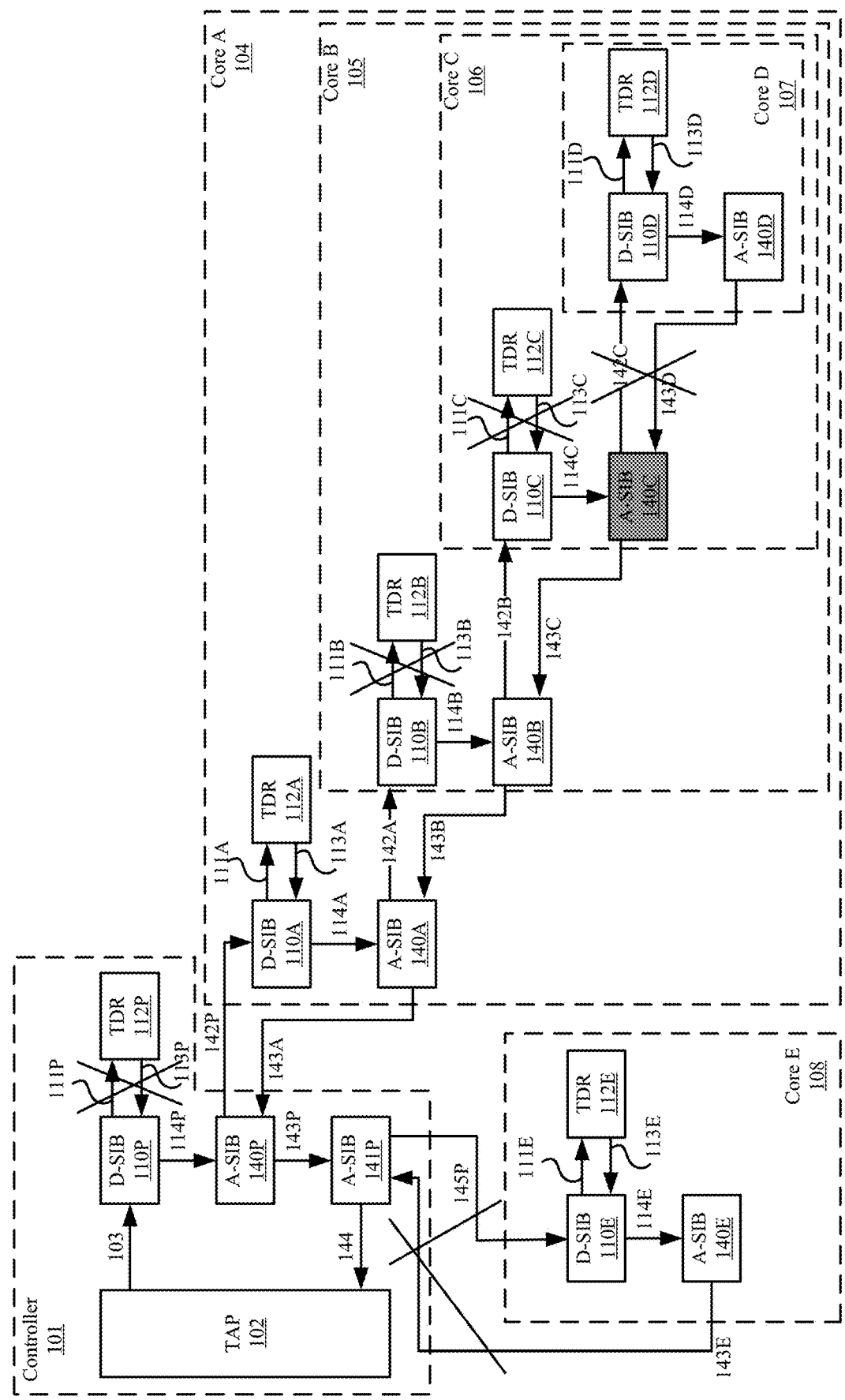
FIG. 9 depicts an alternative to FIG. 5D where a D-SIB in the third iteration is programmed differently for providing IJTAG access to one or more TDRs according to one aspect of the present embodiments.

In the example of FIG. 5A, at time 502 at the third iteration, D-SIB 110A is programmed with a 1 to provide access to its associated TDR 112A in later iteration(s). It is appreciated that D-SIB 110A is programmed with a 1 by shifting data in a similar fashion that has been described with respect to FIGS. 4A-4N. In some embodiments, a value 1 is shifted from A-SIB 140P to D-SIB 110A via connection 142P in order to provide it access to its associated TDR 112A whereas in the previous iteration it was programmed as a 0 to prevent access to its TDR 112A in this iteration. It is appreciated that the data is shifted through sequentially until at time 503 of the third iteration the TDR 112C that has been provided access to by D-SIB 110C is programmed, as illustrated in FIG. 5B. It is appreciated that TDR 112C may be a 32 bit register. As such, 32 bits are shifted to the TDR 112C in order to program it. It is appreciated that once the TDR 112C is programmed, D-SIB 110C is programmed a time 504 with a 0 to prevent programming access to TDR 112C in subsequent iteration(s), as illustrated in FIG. 5C. It is appreciated that since A-SIB 140C was programmed with a 0 in the previous iteration, access to core D 107 is prevented and the data is sequentially shifted back to the parent hierarchical levels until it gets back to the parent node (i.e. controller 101). It is appreciated that each A-SIB on the way back to the parent may be programmed. Referring now to FIG. 5D, at time 505 of the third iteration, A-SIB 140C is programmed with a 1 to provide access to Core D 107, D-SIB 110D and A-SIB 140D in order to revert the design back to its reset state. However, it is appreciated that in some optional embodiments, the A-SIB 140C is programmed with a 0 to prevent access to core D 107, as illustrated in FIG. 9. Referring now to FIG. 5E, at time 506 of the third iteration, A-SIB 140A is programmed with a 0 to prevent access from core A 104 to child hierarchical levels (i.e. core B 105, core C 106, and core D 107) in subsequent iteration(s). Referring now to FIG. 5F, at time 507 of the third iteration, A-SIB 140P is programmed with a 0 to prevent access from controller 101 to child hierarchical levels (i.e. core A 104, core B 105, core C 106, and core D 107). Referring now to FIG. 5G, at time 508 of the third iteration, A-SIB 141P is programmed with a 1 to provide access from the controller 101 to child hierarchical level (i.e. core E 108) in later iteration(s).

Figure 6A:
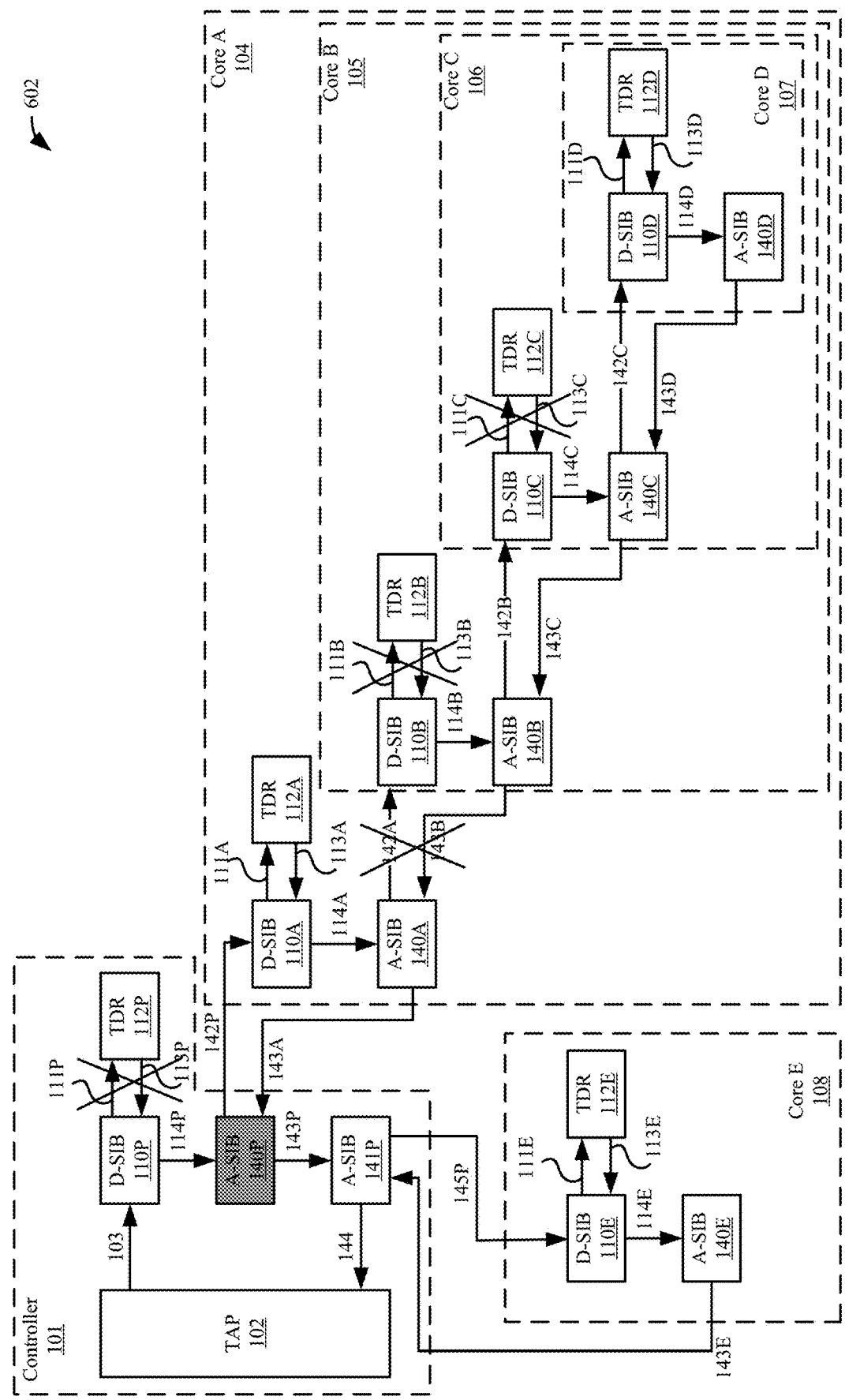
FIGS. 6A-6D depict an example of a plurality of hierarchical electronic components at a fourth iteration for providing IJTAG access to one or more TDRs according to one aspect of the present embodiments.
Figure 6B:
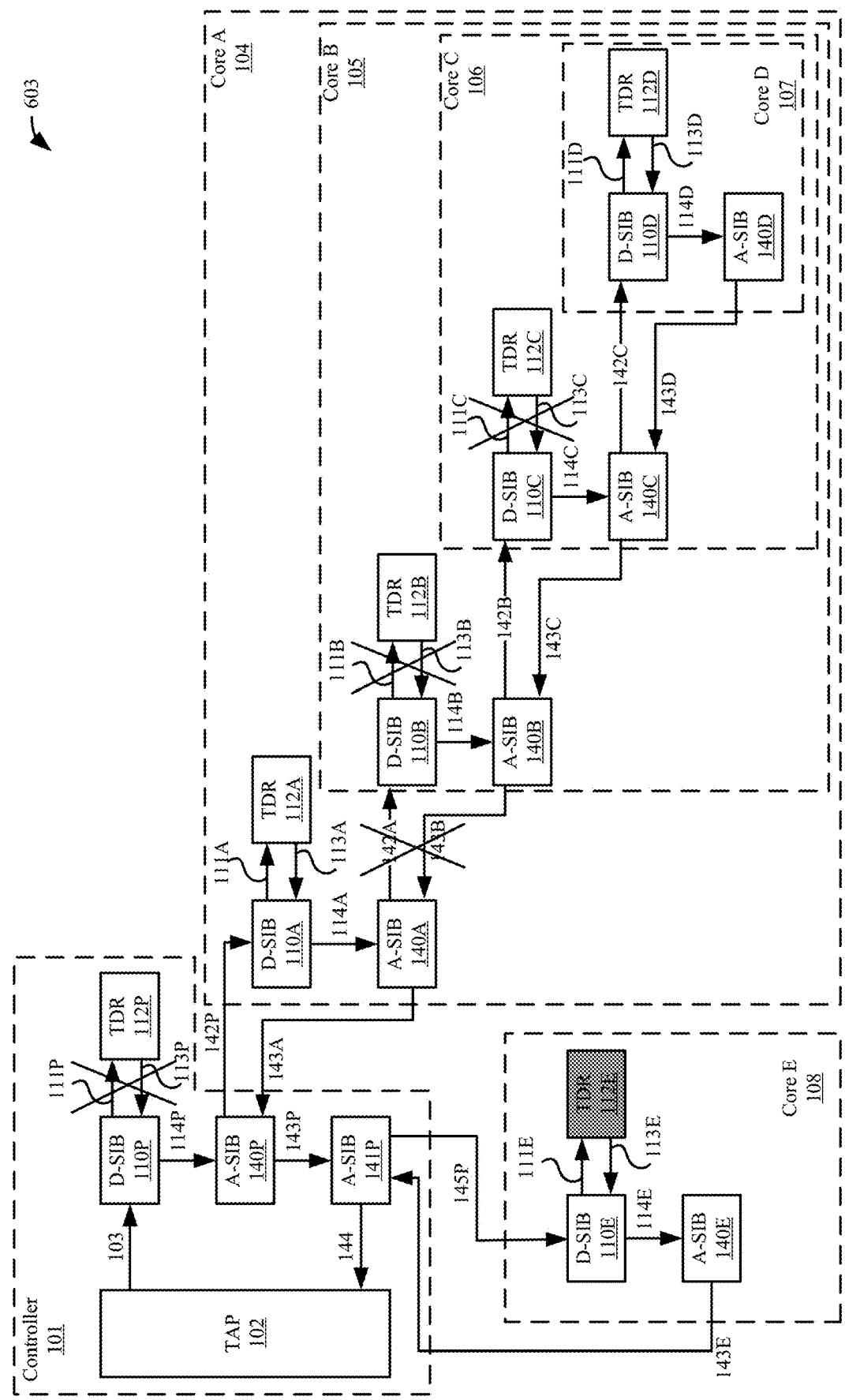
Figure 6C:
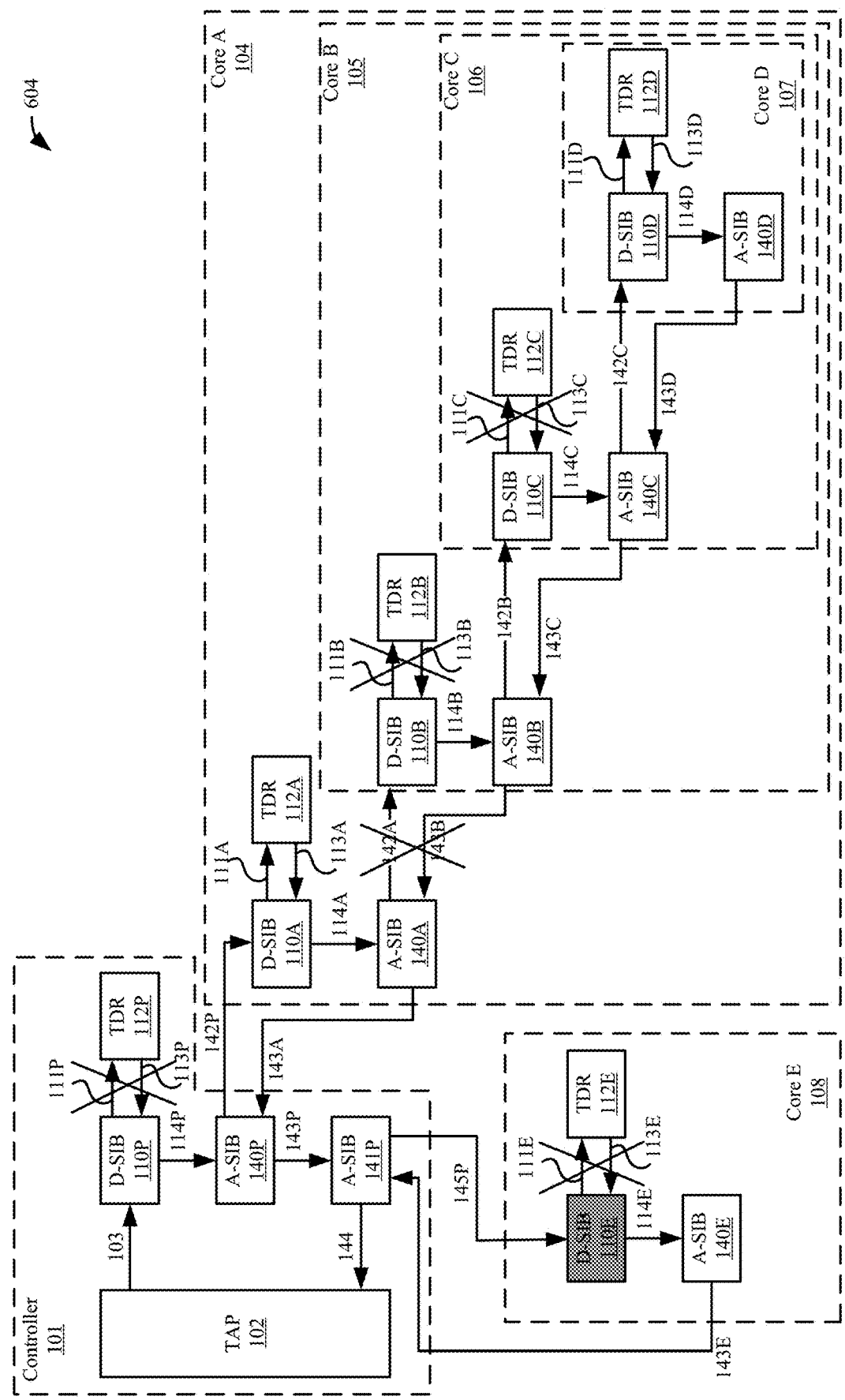
Figure 6D:
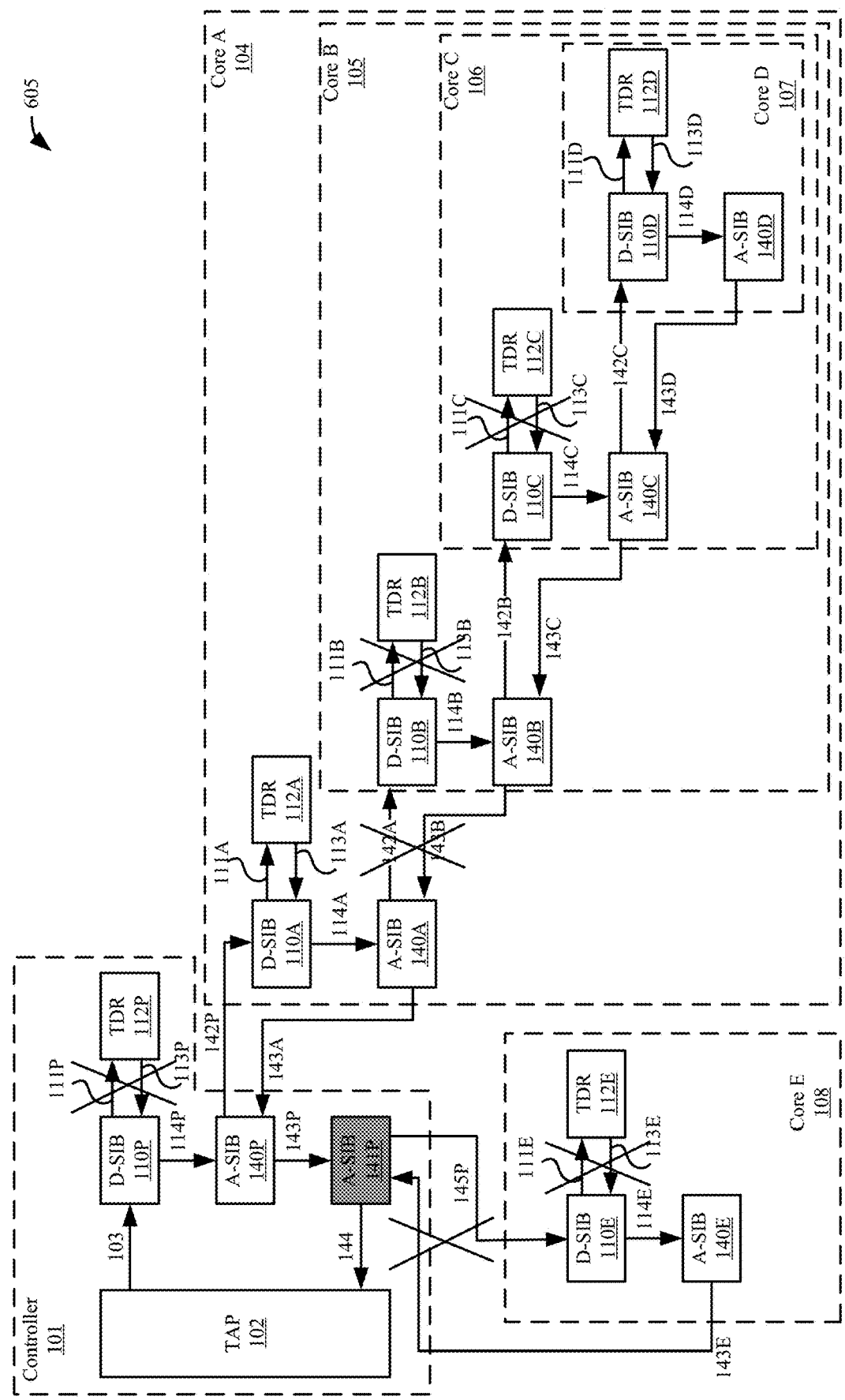

FIGS. 6A-6D depict an example of a plurality of hierarchical electronic components at the end of fourth iteration for providing IJTAG access to one or more TDRs according to one aspect of the present embodiments. It is appreciated that during the fourth iteration the data and programming traverses through TAP 102 to D-SIB 110P to A-SIB 140P to A-SIB 141P to D-SIB 110E to TDR 112E to D-SIB 110E to A-SIB 140E to A-SIB 141P back to the tap 102 in order to program the components that the data is traversing through. In FIG. 6A, at time 602 of the fourth iteration, A-SIB 140P is programmed with a 1 to provide access to the child hierarchical level (i.e. core A 104) in later iteration(s). It is appreciated that A-SIB and D-SIB in this iteration are programmed in a similar fashion that has been described with respect to FIGS. 4A-4N. In FIG. 6B, at time 603 of the fourth iteration, TDR 112E programmed. It is appreciated that TDR 112E may be a 32 bit register and therefore be programmed by shifting 32 bits into the TDR 112E. It is appreciated that TDR 112E has the same size as other TDRs for illustrative purposes but the embodiments should not be construed as limited thereto. For example, TDR 112E may be a 16 bit register whereas TDR 112C may be a 32 bit register. In FIG. 6C, at time 604 of the fourth iteration and after the TDR 112E is programmed, D-SIB 110E is programmed with a 0 to prevent access to TDR 112E in subsequent iteration(s). In FIG. 6D, at time 605, A-SIB 141P is programmed with a 0 to prevent controller 101 access to child hierarchical level (i.e. core E 108) in subsequent iteration(s).

Figure 7A:
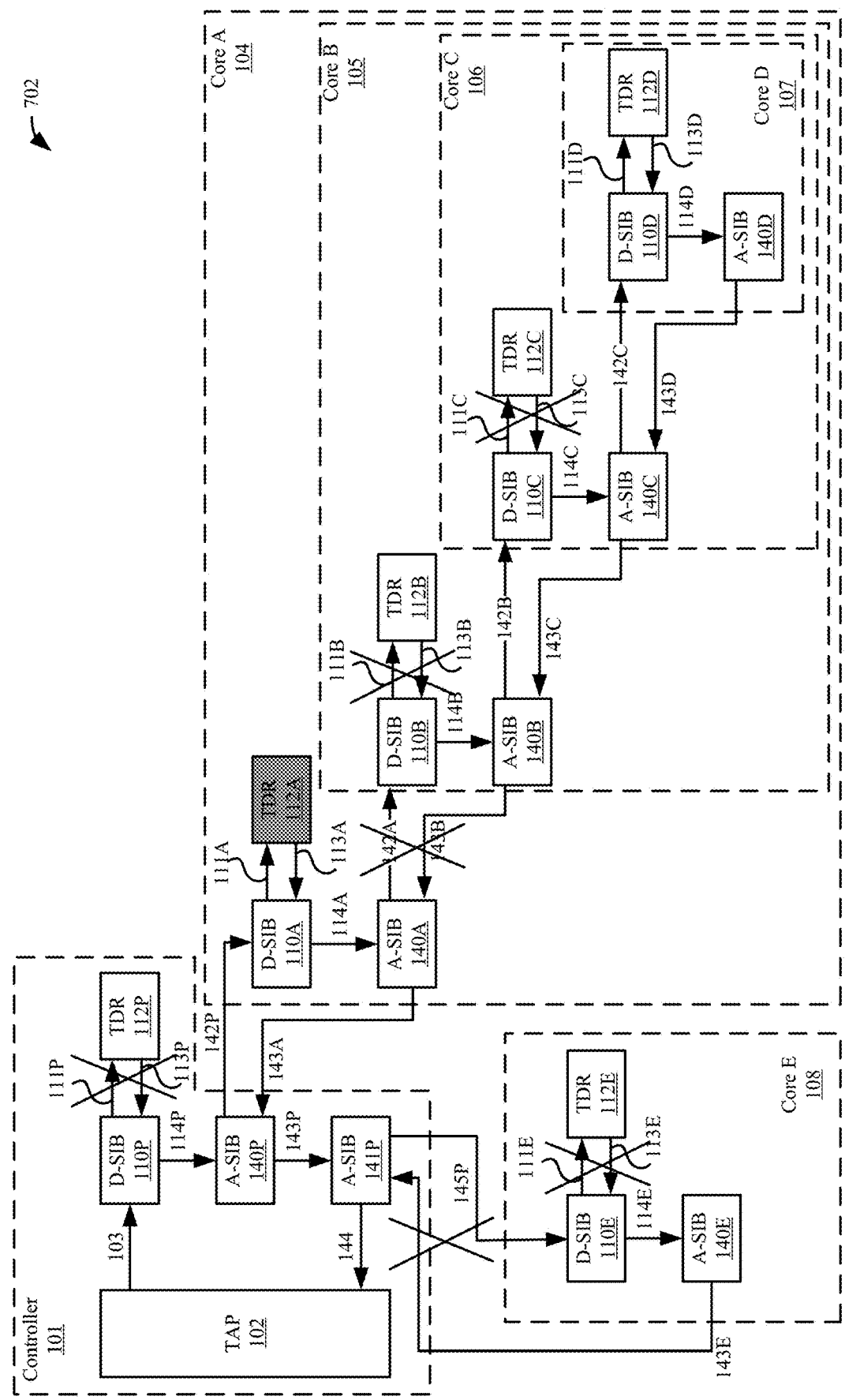
FIGS. 7A-7D depict an example of a plurality of hierarchical electronic components at a fifth iteration for providing IJTAG access to one or more TDRs according to one aspect of the present embodiments.
Figure 7B:
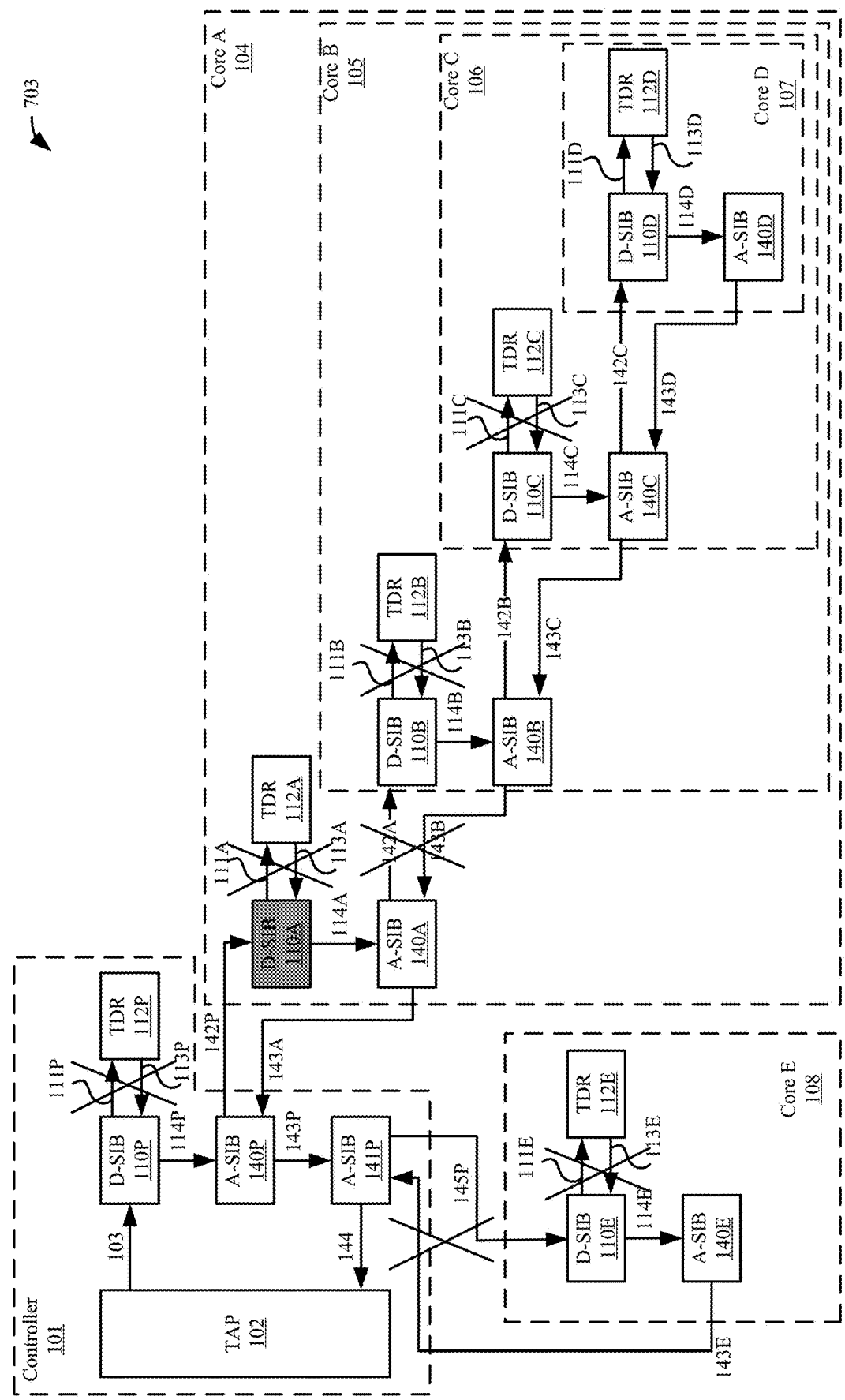
Figure 7C:
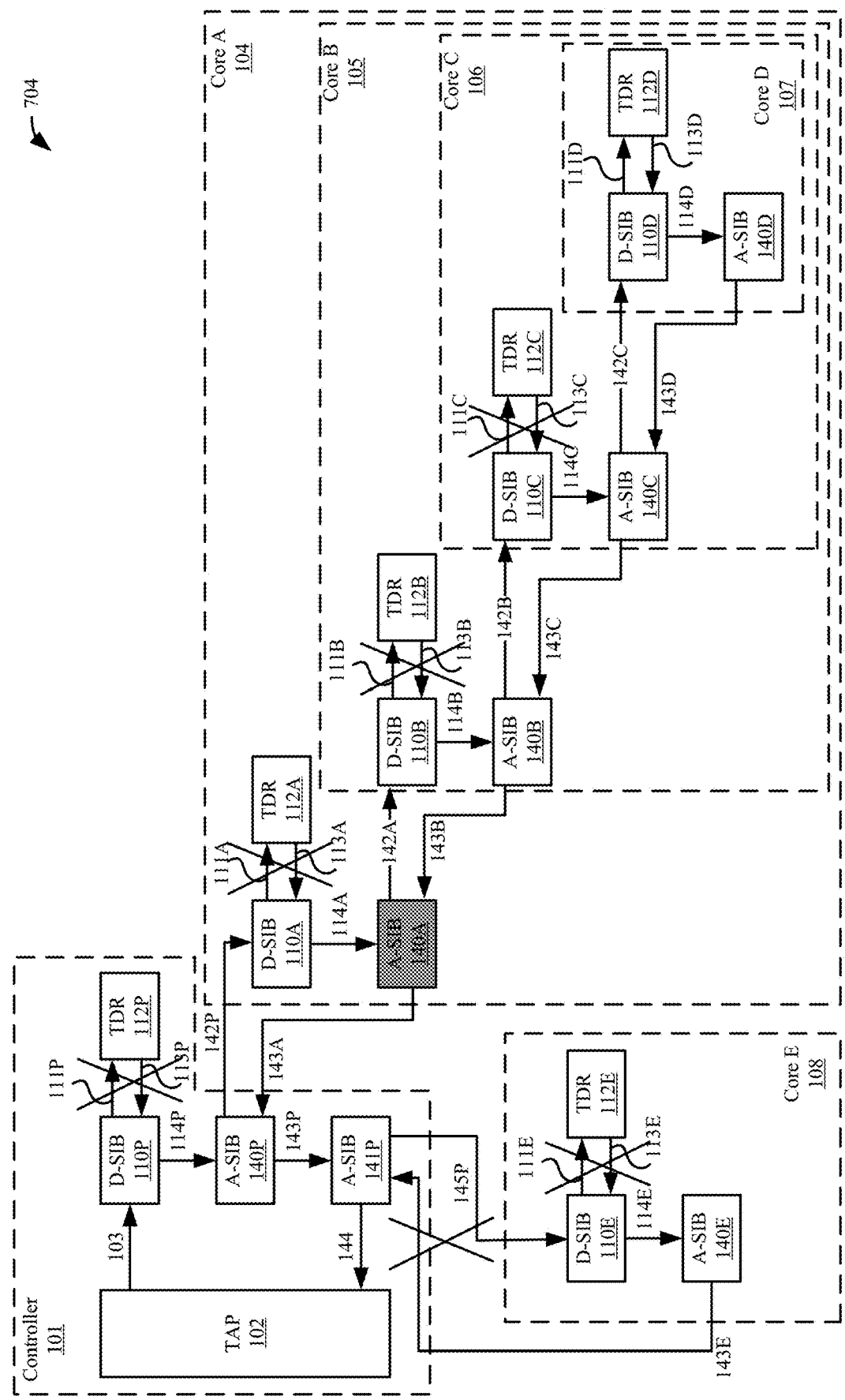
Figure 7D:
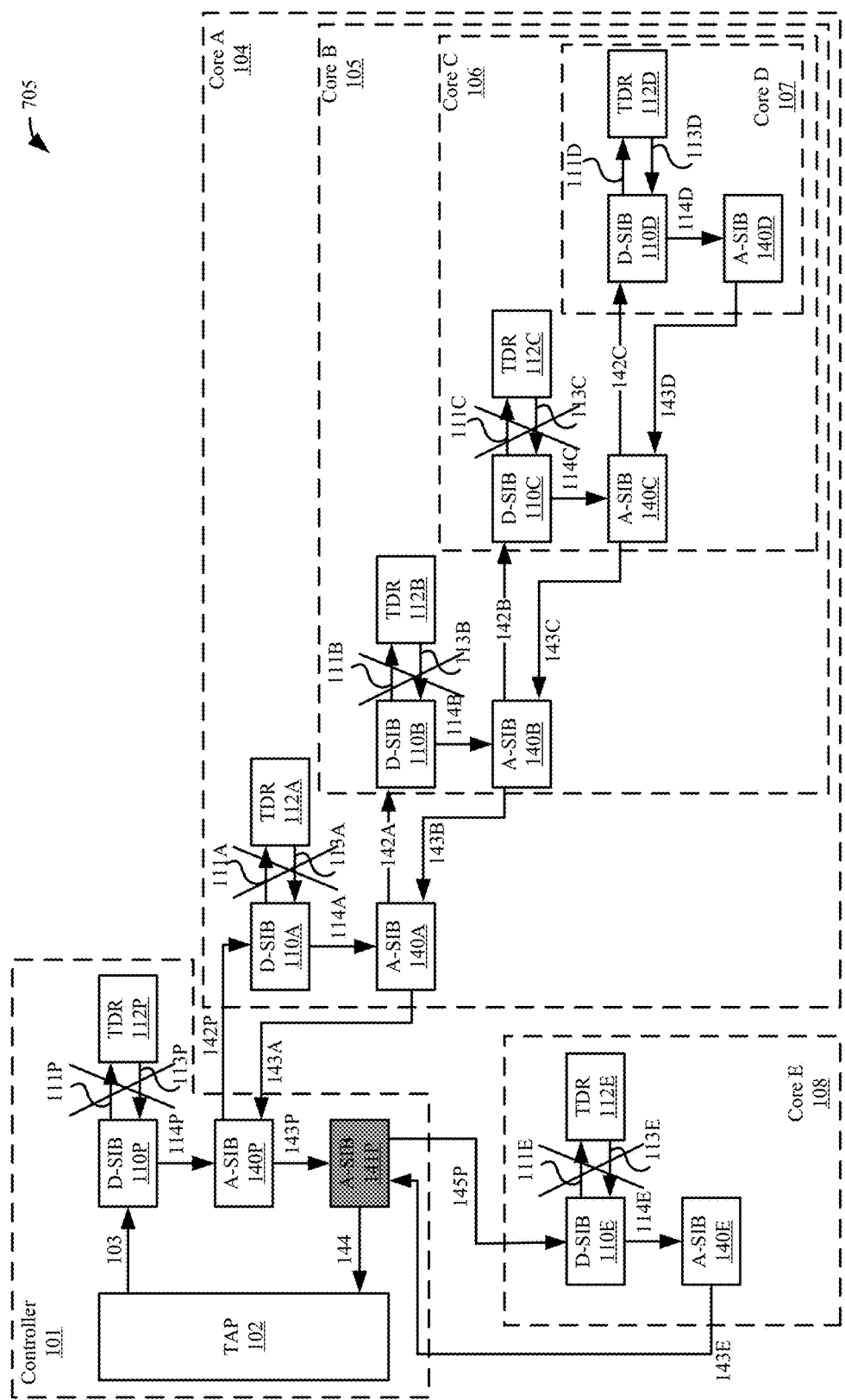

FIGS. 7A-7D depict an example of a plurality of hierarchical electronic components at a fifth iteration for providing IJTAG access to one or more TDRs according to one aspect of the present embodiments. It is appreciated that during the fifth iteration the data and programming traverses through TAP 102 to D-SIB 110P to A-SIB 140P to D-SIB 110A to TDR 112A to D-SIB 110A A-SIB 140A to A-SIB 140P to A-SIB 141P back to the tap 102 in order to program the components that the data is traversing through. In FIG. 7A, at time 702 of the fifth iteration, the TDR 112A is programmed. It is appreciated that the TDR 112A may be the same size as TDR 112C and TDR 112E or it may be sized differently. In FIG. 7B, at time 703 of the fifth iteration and once TDR 112A is programmed, D-SIB 110A is programmed with a 0 to prevent access to TDR 112A in subsequent iteration(s). In FIG. 7C, at time 704 of the fifth iteration, A-SIB 140A is programmed with a 1 to provide access to its child hierarchical level (i.e. core B 105) in subsequent iteration(s). In FIG. 7D, at time 705 of the fifth iteration, A-SIB 141P is programmed with a 1 to provide access to its child (i.e. core E 108) in later iteration(s).

As illustrated, in five iterations TDR 112C, TDR 112E, and TDR 112A are programmed in sequential fashion. Furthermore, as illustrated during programming of TDRs access to unnecessary child hierarchical level may be prevented (e.g. core D 107, in some iterations core E 108, etc.) in order to provide further clock cycle savings. It is appreciated that once the desired TDRs are programmed, access to every hierarchical level is granted while access to unprogrammed TDRs is prevented. As such, IJTAG access is provided to the desired TDRs and data may be read out, in one iteration.

Figure 8:
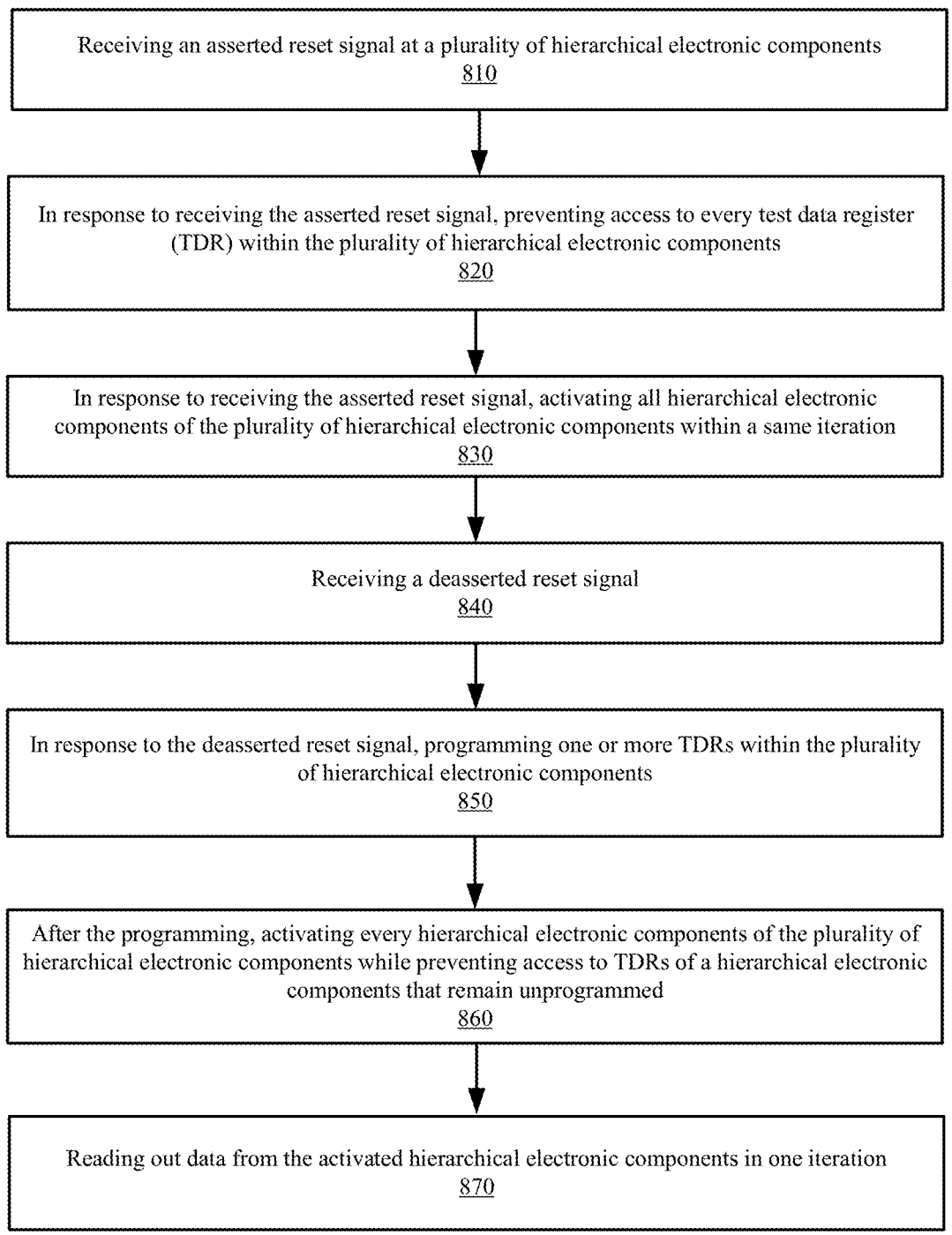
FIG. 8 depicts an example of a flow diagram for providing IJTAG access to one or more TDRs according to one aspect of the present embodiments.

FIG. 8 depicts an example of a flow diagram for providing IJTAG access to one or more TDRs according to one aspect of the present embodiments. Although the figure depicts functional steps in a particular order for purposes of illustration, the processes are not limited to any particular order or arrangement of steps. One skilled in the relevant art will appreciate that the various steps portrayed in this figure could be omitted, rearranged, combined and/or adapted in various ways.

At step 810, an asserted reset signal at a plurality of hierarchical electronic components is received. In response to receiving the asserted reset signal, at step 820, access to every TDR within the plurality of hierarchical electronic components is prevent. In response to receiving the asserted reset signal, at step 830, all hierarchical electronic components of the plurality of hierarchical electronic components are asserted within a same iteration. At step 840, a de-asserted reset signal is received. In response to the de-asserted reset signal, at step 850, one or more TDRs within the plurality of hierarchical electronic components is programmed. It is appreciated that in some embodiments the TDRs may be programmed sequentially (in different iterations) or they may be programmed within the same iteration. It is further appreciated that the TDRs being programmed may be within the same hierarchical level or may belong to different hierarchical levels (e.g. parent/child or two children of the same parent hierarchical level). After the programming, at step 860, every hierarchical electronic components of the plurality of hierarchical electronic components is asserted and provided access to while preventing access to TDRs of a hierarchical electronic components that remain unprogrammed. At step 870, data from the asserted hierarchical electronic components is read out in one iteration.

It is appreciated that the embodiments are described with respect to using a D-SIB to provide access to a TDR and to use a parent A-SIB to provide access to a child network A-SIB and D-SIB for illustrative purposes only and it should not be construed as limiting the scope of the embodiments. For example, an A-SIB may equally be used to provide access to a TDR and/or a D-SIB may be used to provide access to a child network, e.g., A-SIB and D-SIB.

The foregoing description of various embodiments of the claimed subject matter has been provided for the purposes of illustration and description. It is not intended to be exhaustive or to limit the claimed subject matter to the precise forms disclosed. Many modifications and variations will be apparent to the practitioner skilled in the art. Embodiments were chosen and described in order to best describe the principles of the invention and its practical application, thereby enabling others skilled in the relevant art to understand the claimed subject matter, the various embodiments and the various modifications that are suited to the particular use contemplated.

What is claimed is:

1. A hardware-based system, comprising:
    a test access port (TAP) configured to provide internal joint test action group (IJTAG) access to one or more test data registries (TDRs);
    a first hierarchical electronic components coupled to the TAP, wherein the first hierarchical electronic components includes a first de-asserted segment inserted bit (D-SIB) register, a first asserted segment inserted bit (A-SIB) register, and a first TDR of the one or more TDRs, wherein the first D-SIB register is coupled to the first TDR, and wherein the first A-SIB register is coupled to a second hierarchical electronic components;
    said second hierarchical electronic components coupled as a child to the first hierarchical electronic components, wherein the second hierarchical electronic components includes a second D-SIB register, a second A-SIB register, and a second TDR of the one or more TDRs, wherein the second D-SIB register is coupled to the second TDR, and wherein the second A-SIB register is coupled to a third hierarchical electronic components; and
    the third hierarchical electronic components coupled as a child to the second hierarchical electronic components, wherein the third hierarchical electronic components includes a third D-SIB register, a third A-SIB register, and a third TDR, wherein the third D-SIB register is coupled to the third TDR,
    wherein in a first iteration each D-SIB register is configured to prevent access to its associated TDR when a reset signal is asserted and wherein each A-SIB register is asserted.

2. The hardware-based system of claim 1, wherein the first hierarchical electronic components is a Design For Test (DFT) controller, and wherein the second and the third hierarchical electronic components are each a core comprising a processor and a memory component.

3. The hardware-based system of claim 1, wherein the second D-SIB register receives data from the first A-SIB register, and wherein the third D-SIB register receives data from the second A-SIB register, and wherein the second A-SIB register receives data from the third A-SIB register and wherein the first A-SIB register receives data from the second A-SIB register.

4. The hardware-based system of claim 3, wherein the first D-SIB register receives data from the TAP and wherein the first A-SIB register receives data from the first D-SIB register, and wherein the second A-SIB register receives data from the second D-SIB register, and wherein the third A-SIB register receives data from the third D-SIB register.

5. The hardware-based system of claim 1, wherein each A-SIB register and D-SIB register is a one bit register, and wherein after the reset signal is de-asserted a D-SIB register of a given hierarchical electronic components is programmed to selectively provide or prevent access to a TDR associated therewith and wherein after the reset signal is de-asserted an A-SIB register of the given hierarchical electronic components is programmed to selectively provide or prevent access to its child hierarchical electronic components.

6. The hardware-based system of claim 1, wherein subsequent to completion of TDR programming, each A-SIB register provides access to any A-SIB register or D-SIB register coupled thereto and wherein each D-SIB register associated with a TDR that has been programmed provides access to the programmed TDR and wherein each D-SIB register associated with a TDR that remains unprogrammed prevents access to the unprogrammed TDR.

7. The hardware-based system of claim 1, wherein architecture and components of an A-SIB register is the same as a D-SIB register except that the reset signal drives a reset port of a flipflop within a D-SIB register whereas the reset signal drives a set port of a flipflop in an A-SIB register.

8. The hardware-based system of claim 1 further comprising a fourth hierarchical electronic components coupled as a child to the first hierarchical electronic components, wherein the fourth hierarchical electronic components includes a fourth D-SIB register, a fourth A-SIB register, and a fourth TDR, wherein the fourth D-SIB register is coupled to the fourth TDR.

9. The hardware-based system of claim 8, wherein the first hierarchical electronic components further includes a fifth A-SIB register that receives data from the first A-SIB register, and wherein the fifth A-SIB register sends data from the first hierarchical electronic components to the fourth D-SIB register, and wherein the fifth A-SIB register receives data from the fourth A-SIB register.

10. A hardware-based system, comprising:
a test access port (TAP) configured to provide internal joint test action group (IJTAG) access to one or more test data registry (TDR); and
a plurality of hierarchical electronic components, wherein each hierarchical electronic component includes a de-asserted segment inserted bit (D-SIB) register, an asserted segment inserted bit (A-SIB) register, and a TDR associated with the D-SIB register,
wherein in a first iteration each D-SIB register is configured to prevent access to its associated TDR when a reset signal is asserted and wherein each A-SIB register is asserted.

11. The hardware-based system of claim 10, wherein each A-SIB register and each D-SIB register is a one bit register, and wherein providing and denying access is through one iteration by sequentially shifting one bit of data at a time through every A-SIB register and D-SIB register of the plurality of hierarchical electronic components.

12. The hardware-based system of claim 10, wherein after the reset signal is de-asserted and subsequent to the first iteration, a D-SIB register of a given hierarchical electronic components is programmed to selectively provide or prevent write access to a TDR associated therewith and wherein after the reset signal is de-asserted an A-SIB register of the given hierarchical electronic components is programmed to selectively provide or prevent access to its child hierarchical electronic components.

13. The hardware-based system of claim 12, wherein a TDR that is provided with write access is written to and programmed.

14. The hardware-based system of claim 13, wherein two or more TDRs in different hierarchical electronic components are written to within a same iteration.

15. The hardware-based system of claim 13, wherein two or more TDRs in different hierarchical electronic components are written to in different iterations and in sequential fashion.

16. The hardware-based system of claim 12, wherein after completion of programming TDRs in the plurality of hierarchical electronic components, each D-SIB register associated with a programmed TDR provides access to its TDR and each D-SIB register associated with an unprogrammed TDR prevents access to its unprogrammed TDR, and wherein each A-SIB register in the plurality of hierarchical electronic components provides access to an A-SIB register or D-SIB register coupled thereto.

17. The hardware-based system of claim 10, wherein a hierarchical electronic components incudes a Design For Test (DFT) controller.

18. The hardware-based system of claim 10, wherein a hierarchical electronic components includes a core having a processor and a memory component.

19. The hardware-based system of claim 10, wherein architecture and components of an A-SIB register is the same as a D-SIB register except that the reset signal drives a reset port of a flipflop within a D-SIB register whereas the reset signal drives a set port of a flipflop in an A-SIB register.

20. A method comprising:
receiving an asserted reset signal at a plurality of hierarchical electronic components;
in response to receiving the asserted reset signal, preventing access to every test data register (TDR) within the plurality of hierarchical electronic components;
in response to receiving the asserted reset signal, asserting all hierarchical electronic components of the plurality of hierarchical electronic components within a same iteration;
receiving a de-asserted reset signal;
in response to the de-asserted reset signal, programming one or more TDRs within the plurality of hierarchical electronic components;
after the programming, asserting every hierarchical electronic components of the plurality of hierarchical electronic components while preventing access to TDRs of a hierarchical electronic components that remain unprogrammed; and
reading out data from the asserted hierarchical electronic components in one iteration.

21. The method of claim 20, wherein within each iteration one bit of data is shifted through segment inserted bit (SIB) registers and TDRs of the plurality of hierarchical electronic components that are provided access to sequentially.

22. The method of claim 20, wherein the reading out provides internal joint test action group (IJTAG) access to one or more TDRs.

23. The method of claim 20, wherein at least two TDRs are programmed within a same iteration.

24. The method of claim 20, wherein at least one TDR that is being programmed is within a hierarchical electronic components and wherein at least another TDR that is being programmed is within another hierarchical electronic components, and wherein the at least one TDR and the at least another TDR are programmed within a same iteration.

25. A hardware-based system, comprising:
a means for receiving an asserted reset signal at a plurality of hierarchical electronic components;
a means for preventing access to every test data register (TDR) within the plurality of hierarchical electronic components in response to receiving the asserted reset signal;
a means for asserting all hierarchical electronic components of the plurality of hierarchical electronic components within a same iteration in response to receiving the asserted reset signal;
a means for receiving a de-asserted reset signal;
a means for programming one or more TDRs within the plurality of hierarchical electronic components in response to the de-asserted reset signal;
a means for asserting every hierarchical electronic components of the plurality of hierarchical electronic components while preventing access to TDRs of a hierarchical electronic components that remain unprogrammed, after the programming; and
a means for reading out data from the asserted hierarchical electronic components in one iteration.

* * * * *